(12) United States Patent
Hiramatsu et al.

(10) Patent No.: US 6,731,496 B2
(45) Date of Patent: May 4, 2004

(54) ELECTROSTATIC CHUCK

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/019,311

(22) PCT Filed: May 9, 2001

(86) PCT No.: PCT/JP01/03861

§ 371 (c)(1),
(2), (4) Date: Apr. 9, 2002

(87) PCT Pub. No.: WO01/86717

PCT Pub. Date: Nov. 15, 2001

(65) Prior Publication Data

US 2003/0026060 A1 Feb. 6, 2003

(30) Foreign Application Priority Data

May 10, 2000 (JP) .............................. 2000-136767

(51) Int. Cl.$^7$ ................................................ H01G 4/06
(52) U.S. Cl. ................ 361/321.2; 361/311; 361/313; 361/234; 361/321.4; 219/444.1; 219/544
(58) Field of Search .................. 361/321.2, 234, 361/230, 233, 311, 313, 306.1, 321.4, 321.5; 219/444.1, 200, 544, 385

(56) References Cited

U.S. PATENT DOCUMENTS

| 4,692,836 A | * | 9/1987 | Suzuki |
| 5,151,845 A | * | 9/1992 | Watanabe et al. |
| 5,463,526 A | * | 10/1995 | Mundt |
| 5,909,355 A | * | 6/1999 | Parkhe |
| 5,946,183 A | | 8/1999 | Yamada et al. |
| 6,028,762 A | * | 2/2000 | Kamitani |
| 6,465,763 B1 | | 10/2002 | Ito et al. |
| 6,475,606 B2 | | 11/2002 | Niwa |
| 6,507,006 B1 | | 1/2003 | Hiramatsu et al. |

FOREIGN PATENT DOCUMENTS

| JP | 3-188645 | 8/1991 |
| JP | 7-326655 | 12/1995 |

OTHER PUBLICATIONS

U.S. patent application Ser. No. 09/471,759, Saito et al., filed Dec. 23, 1999.
U.S. patent application Ser. No. 09/462,067, Furukawa et al.,. filed Jan. 5, 2001.
U.S. patent application Ser. No. 10/345,356, Ito, filed Jan. 16, 2003.
U.S. patent application Ser. No. 09/787,954, Ito, filed Mar. 23, 2001.
U.S. patent application Ser. No. 09/787,816, Ito, filed Mar. 23, 2001.
U.S. patent application Ser. No. 09/787,818, Ito, filed Mar. 23, 2001.
U.S. patent application Ser. No. 09/806,957, Ito et al., filed Apr. 6, 2001.
U.S. patent application Ser. No. 09/926,730, Hiramatsu et al., filed Apr. 16, 2001.

(List continued on next page.)

*Primary Examiner*—Dean A. Reichard
*Assistant Examiner*—Nguyen T. Ha
(74) *Attorney, Agent, or Firm*—Oblon, Spivak, McClelland, Maier & Neustadt, P.C.

(57) ABSTRACT

An electrostatic chuck which allows sufficiently rapid temperature rising/dropping thereof, in case that the diameter of a ceramic substrate is 190 mm or more or especially in case that the diameter of the ceramic substrate is quite large, exceeding 300 mm. The electrostatic chuck includes a ceramic substrate equipped with a temperature controlling means, an electrostatic electrode formed on the ceramic substrate, and a ceramic dielectric film provided on the electrostatic electrode. The ceramic substrate has a diameter exceeding 190 mm and a thickness of 20 mm or less, and the ceramic dielectric film contains oxygen in an amount of 0.1 to 20 weight %.

16 Claims, 7 Drawing Sheets

OTHER PUBLICATIONS

U.S. patent application Ser. No. 09/880,742, Saito et al., Jun. 13, 2001.
U.S. patent application Ser. No. 09/880,359, Saito et al., filed Jun. 13, 2001.
U.S. patent application Ser. No. 09/880,379, Saito et al., filed Jun. 13, 2001.
U.S. patent application Ser. No. 09/915,418, Ito, filed Jun. 27, 2001.
U.S. patent application Ser. No. 09/916,682, Ito, filed Jul. 30, 2001.
U.S. patent application Ser. No. 09/890,358, Ito, Jul. 30, 2001.
U.S. patent application Ser. No. 09/917,749, Ito, filed Jul. 31, 2001.
U.S. patent application Ser. No. 09/958,689, Furukawa et al., Oct. 10, 2001.
U.S. patent application Ser. No. 09/979,676, Zhou, filed Nov. 5, 2001.
U.S. patent application Ser. No. 10/048,894, Furukawa, filed Feb. 1, 2002.
U.S. patent application Ser. No. 10/049,539, Zhou, filed Nov. 7, 2001.
U.S. patent application Ser. No. 10/182,009, Zhou, filed Jul. 24, 2002.
U.S. patent application Ser. No. 10/222,928, Ito, filed Aug. 19, 2002.
U.S. patent application Ser. No. 10/265,413, Ohashi et al., filed Oct. 7, 2002.
U.S. patent application Ser. No. 10/356,519, Ito, filed Feb. 3, 2003.
U.S. patent application Ser. No. 10/217,029, Ito, filed Aug. 13, 2002.
U.S. patent application Ser. No. 09/673,953, Ito et al., filed Dec. 21, 2000.
U.S. patent application Ser. No. 09/524,010, Niwa, filed Mar. 13, 2000.
U.S. patent application Ser. No. 09/946,463, Niwa, filed Sep. 6, 2001.
U.S. patent application Ser. No. 10/244,008, Niwa, filed Sep. 16, 2002.
U.S. patent application Ser. No. 09/806,477, Ito et al., filed Jun. 25, 2001.
U.S. patent application Ser. No. 09/831,887, Ito et al., filed May 23, 2001.
U.S. patent application Ser. No. 09/807,960, Hiramatsu et al., filed May 18, 2001.
U.S. patent application Ser. No. 09/806,478, Ito et al., filed Jul. 26, 2001.
U.S. patent application Ser. No. 09/869,321, Zhou, filed Oct. 18, 2001.
U.S. patent application Ser. No. 09/926,012, Hiramatsu et al., filed Oct. 24, 2001.
U.S. patent application Ser. No. 09/926,092, Ito et al., filed Dec. 27, 2001.
U.S. patent application Ser. No. 09/926,297, Hiramatsu et al., filed Dec. 26, 2001.
U.S. patent application Ser. No. 09/926,296, Ito et al., filed Dec. 27, 2001.
U.S. patent application Ser. No. 09/926,362, Hiramatsu et al., filed Jan. 16, 2002.
U.S. patent application Ser. No. 09/926,465, Furukawa et al., filed Feb. 12, 2002.
U.S. patent application Ser. No. 09/926,464, Hiramatsu et al., filed Jan. 10, 2002.
U.S. patent application Ser. No. 09/926,499, Hiramatsu et al., filed Mar. 26, 2002.
U.S. patent application Ser. No. 09/926,714, Ito et al., filed Dec. 6, 2001.
U.S. patent application Ser. No. 09/926,713, Hiramatsu, filed Mar. 5, 2002.
U.S. patent application Ser. No. 10/009,174, Hiramatsu et al. filed Apr. 21, 2003.
U.S. patent application Ser. No. 10/009,480, Hiramatsu et al., filed Mar. 27, 2002.
U.S. patent application Ser. No. 10/019,448, Ito et al., filed Apr. 8, 2002.
U.S. patent application Ser. No. 09/926,800, Hiramatsu et al., filed Mar. 19, 2002.
U.S. patent application Ser. No. 10/019,444, Hiramatsu et al., filed Apr. 23, 2002.
U.S. patent application Ser. No. 10/019,280, Ito et al., filed Apr. 22, 2002.
U.S. patent application Ser. No. 10/019,311, Hiramatsu et al., filed Apr. 9, 2002.
U.S. patent application Ser. No. 10/049,293, Ito et al., filed Apr. 30, 2002.
U.S. patent application Ser. No. 10/069,943, Ito et al., filed Jul. 10, 2002.
U.S. patent application Ser. No. 10/048,490, Ito et al., filed Apr. 30, 2002.
U.S. patent application Ser. No. 10/088,100, Ido, filed Jun. 26, 2002.
U.S. patent application Ser. No. 10/168,527, Hiramatsu et al., filed Jun. 28, 2002.
U.S. patent application Ser. No. 10/311,368, Ito et al., filed Dec. 16, 2002.
U.S. patent application Ser. No. 10/416,497, Hiramatsu et al., filed May 19, 2003.

\* cited by examiner

ELECTROSTATIC CHUCK

TECHNICAL FIELD

The present invention relates to an electrostatic chuck used mainly in the semiconductor industry, and particularly to an electrostatic chuck which is thin, has small heat capacity and is excellent in the temperature rising/dropping property.

BACKGROUND ART

Semiconductors are very important products necessitated by various industries. Semiconductor chips are produced, for example, by first preparing a silicon wafer by slicing silicon single crystal at a predetermined thickness and then forming a plurality of integrated circuits and the like on the silicon wafer.

In the production process of semiconductor chips as described above, a semiconductor wafer such as a silicon wafer and the like is set on a device which allows various types of processing of the semiconductor wafer, and subjected to various types of processing including etching, CVD and the like, whereby integrated circuits, elements and the like are formed thereon.

When a semiconductor wafer is subjected to such processing, the semiconductor wafer must be firmly fixed to the device. For this reason, an electrostatic chuck inside of which electrostatic electrodes for attracting and firmly holding a semiconductor wafer are provided is generally employed.

As materials for constituting an electrostatic chuck, oxide ceramics such as alumina or nitride ceramics are used. In the case of an electrostatic chuck using ceramics as described above, electrostatic electrodes are formed on a ceramic substrate and a thin dielectric film is formed on each electrostatic electrode, so that the semiconductor wafer is adsorbed to the ceramic substrate by Coulomb force through the dielectric film.

In case that the hot CVD and the like is performed, as the semiconductor wafer needs to be heated, the electrostatic chuck is generally provided with a means for heating the ceramic substrate, such as a resistance heating element and the like.

In the electrostatic chuck using ceramics as described above, as Young's modulus (strength) thereof is relatively large even at a high temperature, the thickness of the ceramic substrate can be made relatively thin and thus the weight of the electrostatic chuck can be characteristically reduced.

SUMMARY OF THE INVENTION

However, in recent years, as the size of semiconductor wafer becomes larger and the area of a ceramic substrate inevitably increases, the heat capacity of electrostatic chuck is getting higher. As a result, the temperature of a ceramic substrate is less likely to promptly follow the change in the voltage or current amount and the rate of temperature rising/dropping is slowed, whereby there arose a problem that the productivity of semiconductor wafers and the like is deteriorated.

Further, when a ceramic substrate of a relatively large size whose diameter exceeds 300 mm is used in order to adapt to a semiconductor wafer of 12 inches, the temperature tends to drop exceedingly at the periphery of the ceramic substrate, whereby there arose a problem that the temperature distribution on the heating face of the ceramic substrate is not even.

The present invention has been contrived in order to solve the above-mentioned problems. That is, one object of the present invention is to provide an electrostatic chuck which allows sufficiently rapid temperature rising/dropping thereof, in case that the diameter of a ceramic substrate exceeds 190 mm, or especially even in case that the diameter of the ceramic substrate is quite large, exceeding 300 mm.

As a result of the assiduous study for achieving the above-mentioned object, the inventors of the present invention have discovered that the temperature rising/dropping properties of a ceramic substrate can be prevented from deteriorating by reducing the thickness of the ceramic substrate to 20 mm or less and also reducing the heat capacity of the ceramic substrate. The present invention has been completed on the basis of this discovery.

That is, in a first aspect of the present invention, an electrostatic chuck comprises: a ceramic substrate equipped with a temperature controlling means; an electrostatic electrode formed on the ceramic substrate; and a ceramic dielectric film provided on the above-mentioned electrostatic electrode, wherein: the above-mentioned ceramic substrate has a diameter exceeding 190 mm and a thickness of 20 mm or less; and the above-mentioned ceramic dielectric film contains oxygen in an amount of 0.1 to 20 weight %.

According to the electrostatic chuck of the first aspect of the present invention, by reducing the thickness of the ceramic substrate to 20 mm or less, the temperature dropping at the peripheral portion of the ceramic substrate can be made as small as possible and the heat capacity thereof can be made small, even in case that the ceramic substrate has a relatively large size and the diameter thereof exceeds 190 mm. As a result, an electrostatic chuck which allows rapid temperature rising/dropping thereof can be realized.

When a ceramic substrate has a relatively large diameter, the ceramic substrate tends to deflect due to its own weight and thus a clearance is likely to be generated between the semiconductor wafer and the ceramic substrate, whereby heating of the semiconductor wafer evenly becomes difficult to be performed. Also, the thinner the substrate is, the more the substrate deflects.

However, in the above-mentioned ceramic dielectric film, as the dielectric film contains oxygen in an amount of 0.1 to 20 weight %, rigidity of the dielectric film is Improved so that the magnitude of flexure can be reduced.

In the electrostatic chuck of the first aspect of the present invention, it is preferable to use a resistance heating element as the above-mentioned temperature controlling means, because a resistance heating element can be formed in the electrostatic chuck relatively easily by: coating a conductor containing paste to a green sheet or a sintered body and subjecting the resultant to heating and firing; or embedding a metal wire in a formed body and subjecting the resultant to firing.

In a second aspect of the present invention, an electrostatic chuck comprises: a ceramic substrate equipped with a temperature controlling means; an electrostatic electrode formed on the ceramic substrate; and a ceramic dielectric film provided on the above-mentioned electrostatic electrode, wherein the above-mentioned ceramic substrate has a diameter exceeding 300 mm and a thickness of 20 mm or less.

In a case of a large type ceramic substrate whose diameter exceeds 300 mm, the area of the side face of the periphery thereof is relatively large and heat is easily lost there by being brought into contact with air. As a result, the temperature drop at the periphery of the ceramic substrate is large.

However, in the electrostatic chuck of the second aspect of the present invention, the thickness of the substrate is adjusted to 20 mm or less so that the contact area where the side face of the substrate is brought into contact with air decreases and heat is less likely to be released there and hence the temperature dropping at the peripheral portion can be made small. Also, the thickness of the substrate is adjusted to 20 mm or less so that the heat capacity thereof is made small. Thus, an electrostatic chuck which makes rapid temperature rising/dropping thereof possible is realized.

In the electrostatic chuck of the second aspect of the present invention, the above-mentioned ceramic dielectric film preferably contains oxygen in an amount of 0.1 to 20 weight %.

In case that the diameter of a ceramic substrate exceeds 300 mm, when the thickness of the substrate is made 20 mm or less, the ceramic substrate tends to deflect due to its own weight and thus a clearance is likely to be generated between the semiconductor wafer and the ceramic substrate, whereby even heating of the semiconductor wafer may become difficult to be performed and/or the chucking force may undesirably disperse. However, by setting the content of oxygen in the ceramic dielectric film in a range of 0.1 to 20 weight %, rigidity of the substrate is improved and thus the magnitude of flexure can be reduced.

Further, in the electrostatic chuck of the second aspect of the present invention, it is preferable to use a resistance heating element as the above-mentioned temperature controlling means, because a resistance heating element can be formed in the electrostatic chuck relatively easily by: coating a conductor containing paste to a green sheet or a sintered body and subjecting the resultant to heating and firing; or embedding a metal wire in a formed body and subjecting the resultant to firing.

Yet further, in the electrostatic chuck of the second aspect of the present invention, the thickness of the above-mentioned ceramic dielectric film is preferably in a range of 50 to 5000 μm. When the thickness of the ceramic dielectric film is within in the above-mentioned range, the magnitude of flexure of the ceramic substrate can be reduced.

Incidentally, the publication of JP Kokai Hei 4-304942 discloses an electrostatic chuck which comprises a ceramic substrate whose thickness is 10 mm and diameter is 150 mm. However, in the case of this reference, the problem which the present invention tries to solve does not occur at all because the diameter of the substrate is quite small.

Also, the publication of JP Kokai Hei 7-86379 discloses an electrostatic chuck which includes a ceramic substrate whose thickness is 5 mm and diameter is 210 mm. However, in the case of this reference, the ceramic substrate thereof does not have sufficient rigidity because the content of yttria in the substrate is 2 weight % and this is small. As a result, the chucking force disperses in the electrostatic chuck.

Further, the publication of JP Kokai Hei 10-72260 discloses a ceramic substrate whose diameter is 200 mm and thickness is 12 mm. However, this reference makes no description of the oxygen content of the ceramic substrate.

In short, the above-mentioned references of the prior art are all related to a substrate whose diameter is smaller than 300 mm and irrelevant to the problem of temperature dropping at the periphery of the substrate.

| Explanation of Numerals | |
|---|---|
| 2, 22, 32a, 32b | chuck positive electrostatic layer |
| 2a, 3a | semicircular arc part |
| 2b, 3b | combteeth-shaped part |
| 3, 23, 33a, 33b | chuck negative electrostatic layer |
| 4 | ceramic dielectric film |
| 5 | resistance heating element |
| 6 | external terminal pin |
| 7 | metal wire |
| 8 | Peltier device |
| 9 | silicon wafer |
| 11 | bottomed hole |
| 12 | through hole |
| 15 | resistance heating element |
| 16, 17 | conductor-filled through hole |
| 20, 30, 101 | electrostatic chuck |
| 41 | supporting case |
| 42 | coolant outlet |
| 43 | inhalation duct |
| 44 | coolant inlet |
| 45 | heat insulator |
| 81 | thermocouple |
| 82 | ceramic substrate |

DETAILED DESCRIPTION OF THE INVENTION

First, an electrostatic chuck according to the first aspect of the present invention will be described with reference to the drawings.

In the first aspect of the present invention, an electrostatic chuck comprises: a ceramic substrate equipped with a temperature controlling means; an electrostatic electrode formed on the ceramic substrate; and a ceramic dielectric film provided on the above-mentioned electrostatic electrode, wherein: the above-mentioned ceramic substrate has a diameter exceeding 190 mm and a thickness of 20 mm or less; and the above-mentioned ceramic dielectric film contains oxygen in an amount of 0.1 to 20 weight %.

Figure 1:
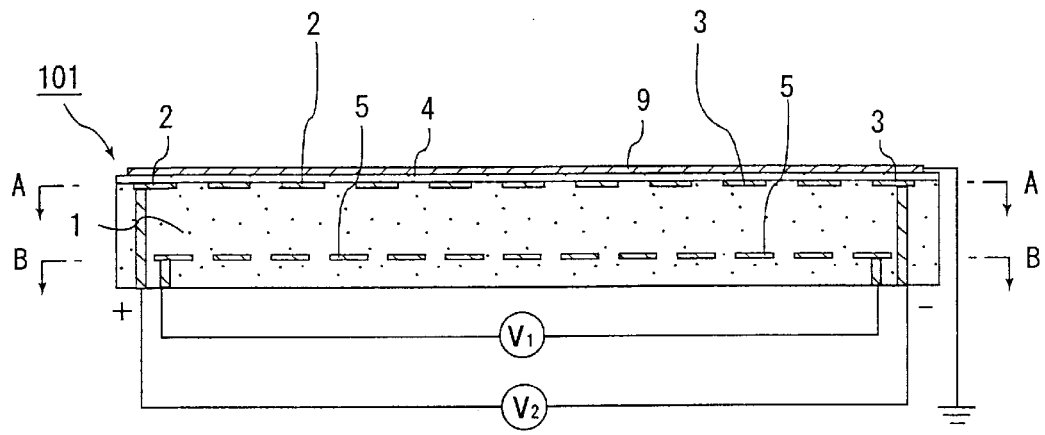
FIG. 1 is a longitudinal sectional view which schematically shows one example of an electrostatic chuck according to the first and the second aspects of the present invention.
Figure 2:
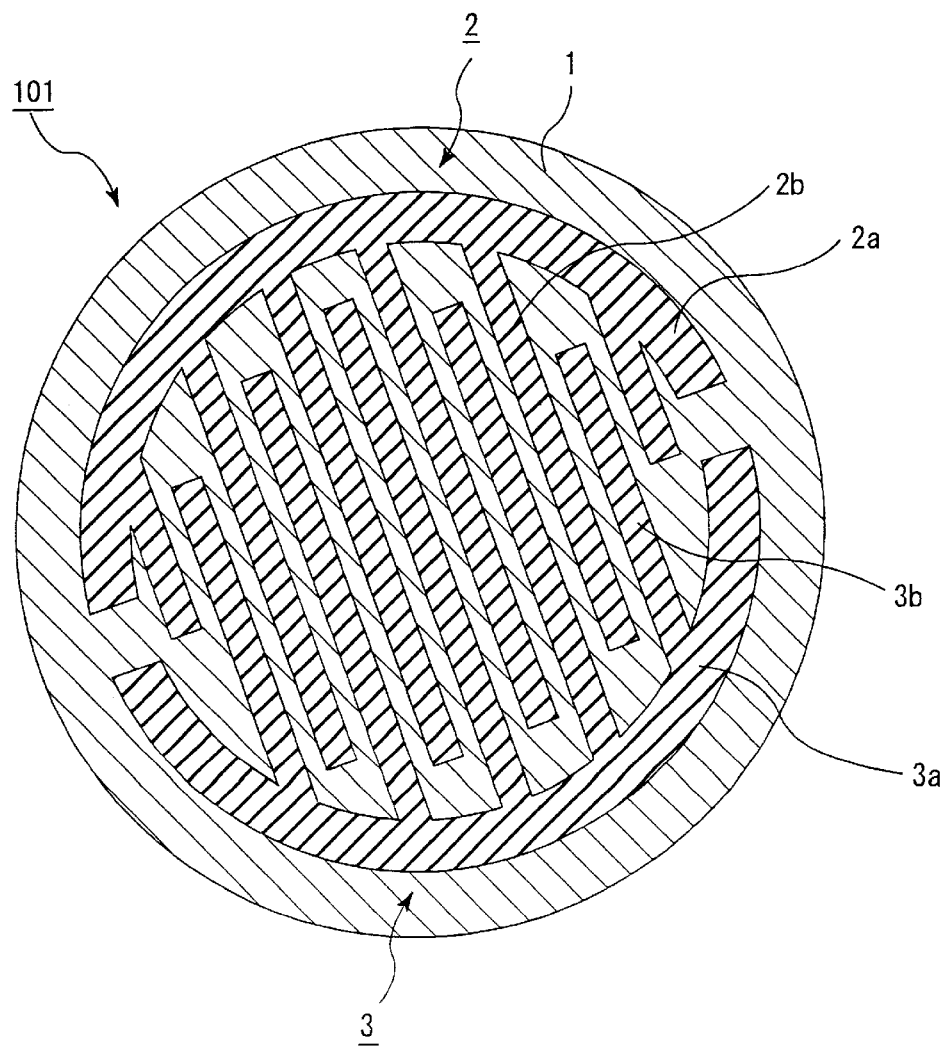
FIG. 2 is a sectional view taken along the A—A line of the electrostatic chuck shown in FIG. 1.
Figure 3:
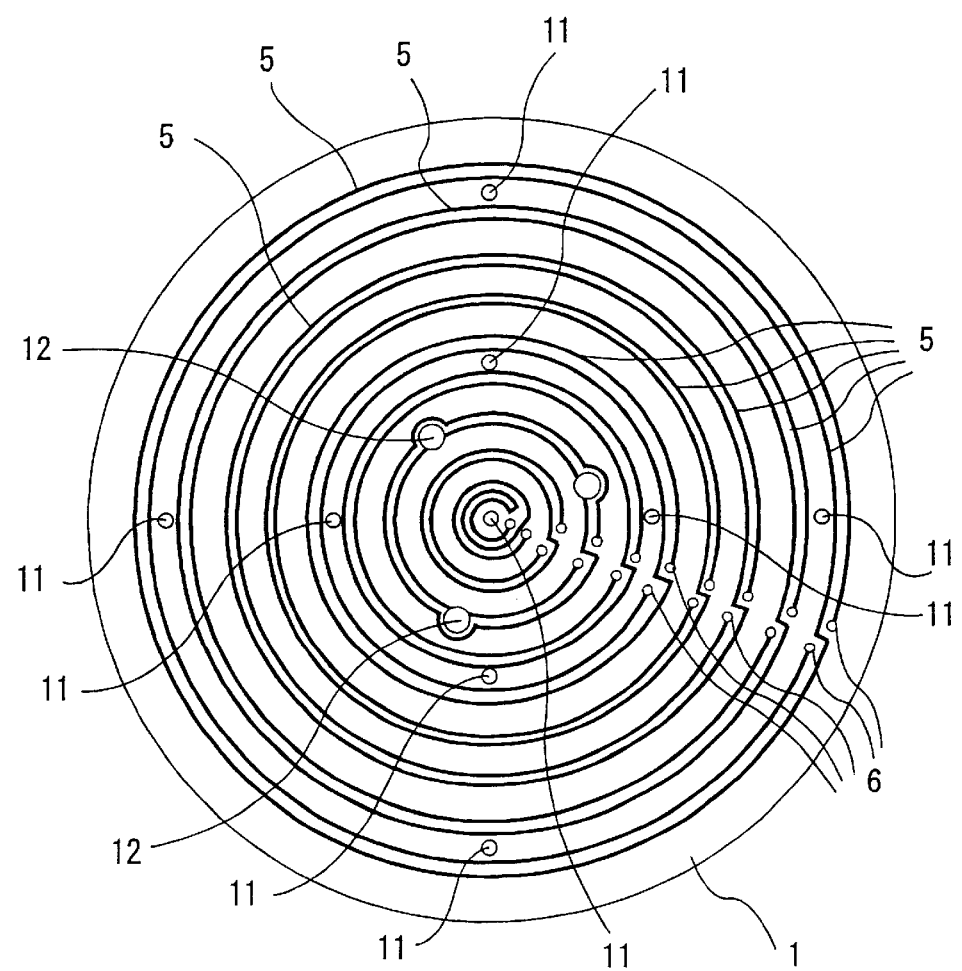
FIG. 3 is a sectional view taken along the B—B line of the electrostatic chuck shown in FIG. 1.

FIG. 1 is a longitudinal sectional view which schematically shows one embodiment of an electrostatic chuck according to the first aspect of the present invention. FIG. 2 is a sectional view taken along the A—A line of the electrostatic chuck shown in FIG. 1. FIG. 3 is a sectional view taken along the B—B line of the electrostatic chuck shown in FIG. 1.

In this electrostatic chuck 101, a chuck positive electrostatic layer 2 having a semicircular arc part 2a and a combteeth-shaped part 2b and a chuck negative electrostatic layer 3 having a semicircular arc part 3a and a combteeth-shaped part 3b are formed on the surface of a disc-shaped ceramic substrate 1 in the manner that the two electrostatic layers face each other and the combteeth-shaped portion 2b and the combteeth-shaped portion 3b cross each other. A thin ceramic dielectric film 4 is further formed on the ceramic substrate 1 which contains the electrostatic electrodes.

The chuck positive electrostatic layer 2 and the chuck negative electrostatic layer 3 are connected to the positive side and the negative side of a direct power source, respectively, so that a direct current voltage $V_2$ is applied thereto. A silicon wafer 9 is set on this electrostatic chuck 101 and grounded.

On the other hand, a resistance heating element 5 having concentric circles-like shape as shown in FIG. 3 as viewed from the above is provided inside the ceramic substrate 1, so that the temperature of the silicon wafer 9 is controlled by the resistance heating element 5. An external terminal pin 6 is connected and fixed to each end of the resistance heating element 5, so that a voltage $V_1$ is applied to each end of the resistance heating element 5 Further, although not shown in FIGS. 1 and 2, bottomed holes 11 to each of which a temperature measuring element is inserted and through holes 12 through each of which a lifter pin (not shown) for supporting and vertically moving the silicon wafer 9 is inserted, are formed in the ceramic substrate 1. The resistance heating element 5 may be formed on the bottom face of the ceramic substrate.

In the above-mentioned structure, when a direct current voltage $V_2$ is applied between the chuck positive electrostatic layer 2 and the chuck negative electrostatic layer 3, the silicon wafer 9 is adsorbed and fixedly held by the ceramic dielectric film 4, due to the electrostatic action (Coulomb force) between the chuck positive electrostatic layer 2 and the chuck negative electrostatic layer 3.

The diameter of the ceramic substrate which constitutes the electrostatic chuck of the first aspect of the present invention exceeds 190 mm, this is because the electrostatic chuck can cope with a silicon wafer of large size. The diameter of the above-mentioned ceramic substrate is preferably 200 mm or more, and more preferably larger than 200 mm. It is especially preferable that the diameter of the ceramic substrate is 300 mm or larger, in terms of well coping with a semiconductor wafer of the next generation.

The thickness of the above-mentioned ceramic substrate is to be 20 mm or less, and preferably 10 mm or less. This is to reduce the heat capacity of the electrostatic chuck by making the electrostatic chuck thinner, to cope with the enlargement of the size of the electrostatic chuck. When the diameter of a ceramic substrate is 300 mm or more, the area of the periphery becomes larger and thus the contact area at which the ceramic substrate is brought into contact with the atmospheric gas such as air becomes larger, whereby the temperature significantly drops at the peripheral portion of the substrate. Therefore, the above-mentioned contact area is reduced by decreasing the thickness of the ceramic substrate, so that the temperature dropping at the peripheral portion is prevented.

Especially, by setting the thickness of the substrate to 10 mm or less, the temperature dropping property is improved. It is particularly preferable that the thickness of the ceramic substrate is within a range of 1 to 5 mm because the dispersion of the temperature on the heating face is decreased.

As described above, the ceramic dielectric film which constitutes the electrostatic chuck of the first aspect of the present invention contains oxygen in an amount of 0.1 to 20 weight %.

The thinner the substrate is, the more the substrate deflects. However, by incorporating the oxygen in a range of 0.1 to 20 weight %, the rigidity of the substrate is improved and the magnitude of fluxure thereof can be decreased.

The electrostatic chuck of the first aspect of the present invention has the above-mentioned structure and is realized, for example, in the embodiment as shown in FIGS. 1 to 3.

Hereinafter, each of the members which constitute the above-mentioned electrostatic chuck, as well as other embodiments and the like of the electrostatic chuck of the first aspect of the present invention, will be described one by one in detail.

The ceramic dielectric film which constitutes the electrostatic chuck of the first aspect of the present invention is provided in a manner that the electrostatic electrodes formed on the ceramic substrate are covered by the ceramic dielectric film.

The ceramic material which constitutes this ceramic dielectric film is not particularly restricted, and examples thereof include nitride ceramic, carbide ceramic, oxide ceramic and the like.

Examples of the above-mentioned nitride ceramic include metal nitride ceramic such as aluminum nitride, silicon nitride, boron nitride, titanium nitride and the like.

Examples of the above-mentioned carbide ceramic include metal carbide ceramic such as silicon carbide, zirconium carbide, titanium carbide, tantalum carbide, tungsten carbide and the like.

Examples of the above-mentioned oxide ceramic include metal oxide ceramic such as alumina, zirconia, cordierite, mullite and the like.

These examples of ceramic may be used solely or in a combination of two or more of them.

Among these examples of ceramic, nitride ceramic and carbide ceramic are more preferable than oxide ceramic because the thermal conductivity of nitride ceramic and that of carbide ceramic is higher than that of oxide ceramic.

Among the examples of the nitride ceramic, aluminum nitride is the most preferable because the thermal conductivity thereof, which is 180 W/m·K, is the highest in the nitride ceramics.

It is preferable that the above-mentioned ceramic dielectric film contains oxygen in an amount of 0.1 to 20 weight %. When the content of oxygen in the ceramic dielectric film is less than 0.1 weight %, a sufficient breakdown voltage cannot be ensured. On the other hand, when the content of oxygen in the ceramic dielectric film exceeds 5 weight %, the breakdown voltage drops due to the deterioration of the high breakdown voltage property of the oxides at a high temperature. Further, when the content of oxygen in the ceramic dielectric film exceeds 20 weight %, the temperature rising/dropping property of the ceramic substrate deteriorates due to the drop in the thermal conductivity.

Firing is carried out: after heating the raw material powder of the nitride ceramic, the carbide ceramic and the like as described above in the air or oxygen gas; or after mixing the above-mentioned raw material powder with metal oxides, in order to incorporate oxygen in the above-mentioned nitride ceramic or the carbide ceramic and the like.

Examples of the above-mentioned metal oxide include yttria ($Y_2O_3$), alumina ($Al_2O_3$), rubidium oxide ($Rb_2O$) lithium oxide ($Li_2O$), calcium carbonate ($CaCO_3$) and the like.

It is preferable that 1 to 20 parts by weight of the metal oxide as described above is added to 100 parts by weight of the nitride ceramic.

The above-mentioned dielectric film may be composed of silicon carbide which contains B, C, Be, BeO and the like as the sintering aid, because such a dielectric film exhibits high mechanical strength and excellent heat resistance.

The above-mentioned ceramic dielectric film desirably contains carbon. In case that the thermal conductivity of the ceramic dielectric film at a high temperature (approximately 500° C.) is to be prevented from decreasing, it is preferable that crystalline carbon is added to the ceramic dielectric film. In case that the volume resistivity of the ceramic dielectric film at a high temperature is to be prevented from decreasing, it is preferable that amorphous carbon is added to the ceramic dielectric film. Accordingly, depending on the application, both the volume resistivity and the thermal conductivity can be simultaneously adjusted in an appropriate manner by adding both crystalline carbon and amorphous carbon thereto.

The crystallinity of carbon can be determined by analyzing the magnitude of peaks in the vicinities of 1550 $cm^{-1}$ and 1333 $cm^{-1}$ obtained when Raman spectrum is measured.

When the ceramic dielectric film contains carbon, the content of carbon contained in the ceramic dielectric film is preferably in a range of 5 to 5000 ppm. When the content of carbon in the ceramic dielectric film is less than 5 ppm, radiant heat is decreased and there arises difficulty in concealing the electrostatic electrodes. On the other hand, when the content of carbon in the ceramic dielectric film exceeds 5000 ppm, the ceramic dielectric film can no longer be made dense and there arises difficulty in suppressing drop in the volume resistivity. The content of carbon in the ceramic dielectric film is most preferably in a range of 100 to 2000 ppm.

In order to make the carbon contained in the ceramic dielectric film into amorphous one, a resin or hydrocarbons and the like which are less likely to become crystalline by heating may be added at the time of producing a formed body by mixing the raw material powder, a resin, a solvent and the like together, thus the formed body is degreased in an atmosphere which contains relatively little oxygen or a non-oxidizing atmosphere. Alternatively, it is acceptable to produce amorphous carbon by heating a hydrocarbon such as saccharose and the like or a resin which are easily made amorphous by heating and then adding the obtained amorphous carbon to the ceramic dielectric film. In case that crystalline carbon is to be added to the ceramic dielectric film, graphite which has been made powdery by pulverizing or crystalline carbon black can be used.

Further, as the decomposing rate of an acrylic resin binder varies depending on the acid value thereof, it is possible to adjust the amount of carbon or crystallinity, to some extent, by changing the acid value of the acrylic resin binder.

The thickness of the above-mentioned ceramic dielectric film is preferably in a range of 50 to 5000 $\mu$m. When the thickness of the above-mentioned ceramic dielectric film is less than 50 $\mu$m, a sufficient breakdown voltage cannot be obtained because the dielectric film is too thin, whereby there is a possibility that the ceramic dielectric film suffers from dielectric breakdown when a silicon wafer is set and adsorbed thereon. In addition, when the thickness of the ceramic dielectric film is less than 50 $\mu$m, the stiffness of the ceramic dielectric film is not sufficient, whereby fluxure of the above-mentioned ceramic substrate cannot be prevented. On the other hand, when the thickness of the ceramic dielectric film exceeds 5000 $\mu$m, the distance between the silicon wafer and the electrostatic electrodes is so large that the capacity of attracting the silicon wafer is deteriorated. Accordingly, the thickness of the ceramic dielectric film is more preferably in a range of 50 to 1500 $\mu$m.

It is preferable that the porosity of the above-mentioned ceramic dielectric film is 5% or less and the diameter of the largest pore is 50 $\mu$m or less.

When the above-mentioned porosity exceeds 5%, the number of the pores present in the ceramic dielectric film increases and the diameter of the pores becomes too large. As a result, the pores are likely to communicate with each other and the breakdown voltage tends to drop in the ceramic dielectric film of such a structure.

On the other hand, when the diameter of the largest pore exceeds 50 $\mu$m, the ratio of the pore diameter with respect to the thickness of the ceramic dielectric film, as well as the proportion of the pores which are communicated with each other, is increased, whereby the breakdown voltage tends to drop.

The porosity is more preferably 0, or 3% or less and the diameter of the largest pore is more preferably 0, or 10 $\mu$m or less.

The porosity and the diameter of the largest pore are adjusted by the length of pressurizing time, the pressure, the temperature during the sintering process and the amount of the additives such as SiC, BN. SiC or BN inhibits the sintering process, thereby facilitating introduction of pores to the ceramic dielectric film.

Measurement of the diameter of the largest pore is carried out by: preparing five samples; grinding the surface of each sample into the mirror plane; photographing the surface of each sample at ten sites by an electron microscope with 2000 to 5000 magnifications; measuring the diameter of the largest pore in each shot; and calculating the average of the diameters of the largest pores of 50 shots.

The porosity is measured by Archimedes' method which includes the steps of: pulverizing the sintered body; mixing the pulverized material with an organic solvent or mercury and measuring the volume of the pulverized material; obtaining the true specific gravity of the pulverized material from the weight and the volume of the pulverized material; and calculating the porosity from the true specific gravity and the apparent gravity of the sintered body.

The ceramic dielectric film may include pores to some extent as described above, because the presence of an acceptable number of open pores at the surface of the ceramic dielectric film facilitates smooth dechucking.

Examples of the electrostatic electrodes formed on the ceramic substrate include a sintered body of metal or conductive ceramic, metal foils and the like. The metal sintered body is preferably made of at least one kind of metal selected from tungsten and molybdenum. The metal foils are preferably made of the same material as the metal sintered body, because these metals are relatively less likely to be oxidized and have sufficient conductivity as an electrode. As the conductive ceramic, at least one kind selected from the group consisting of carbide of tungsten and carbide of molybdenum can be used.

Examples of the material of the ceramic substrate used in the electrostatic chuck of the first aspect of the present invention include nitride ceramic, carbide ceramic, oxide ceramic and the like.

Examples of the above-mentioned nitride ceramic, the above-mentioned carbide ceramic and the above-mentioned oxide ceramic as the material of the ceramic substrate include those raised in the description of the above-mentioned ceramic dielectric film.

Among these examples of ceramic described above, nitride ceramic and carbide ceramic are preferable because nitride ceramic and carbide ceramic have relatively high thermal conductivity and thus can excellently conduct the heat generated at the resistance heating element.

It is preferable that the ceramic dielectric film and the ceramic substrate are made from the same materials, because in such a case, the production process of the electrostatic chuck can be easily carried out by laminating green sheets produced by the same method and firing the lamination in the same condition.

Among the examples of nitride ceramic, aluminum nitride is the most preferable because the thermal conductivity thereof, which is 180 W/m·K, is the highest in the nitride ceramics.

The above-mentioned ceramic substrate may include carbon because carbon contributes to generation of high radiation heat. The content of carbon in the ceramic substrate is preferably in a range of 5 to 5000 ppm.

Carbon may be either in the crystalline state, for example in the form of graphite powder, or in the amorphous state as is achieved by using a hydrocarbon or a resin which are easily made amorphous. Alternatively, both of carbon in the crystalline state and carbon in the amorphous state may be used together.

The ceramic such as nitride ceramic which constitutes the ceramic substrate preferably contains 0.1 to 20 weight % of metal oxides therein, as is the case with the ceramic dielectric film.

It is preferable that the porosity of the above-mentioned ceramic substrate is 5% or less and the diameter of the largest pore is 50 $\mu$m or less. Further, the porosity is more preferably 0, or 3% or less and the diameter of the largest pore is 0, or 10 $\mu$m or less.

Figure 8:
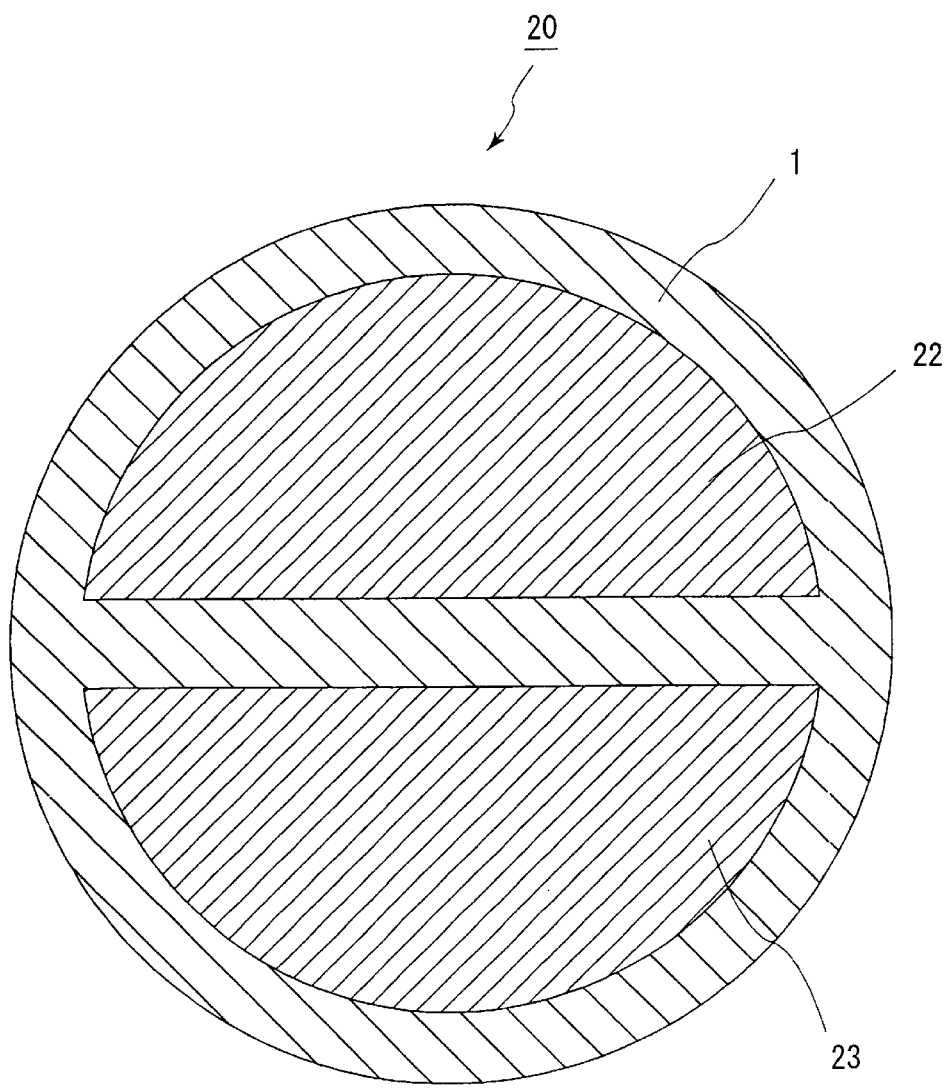
FIG. 8 is a horizontal sectional views schematically showing one example of electrostatic electrodes which constitute an electrostatic chuck according to the first and the second aspects of the present invention.
Figure 9:
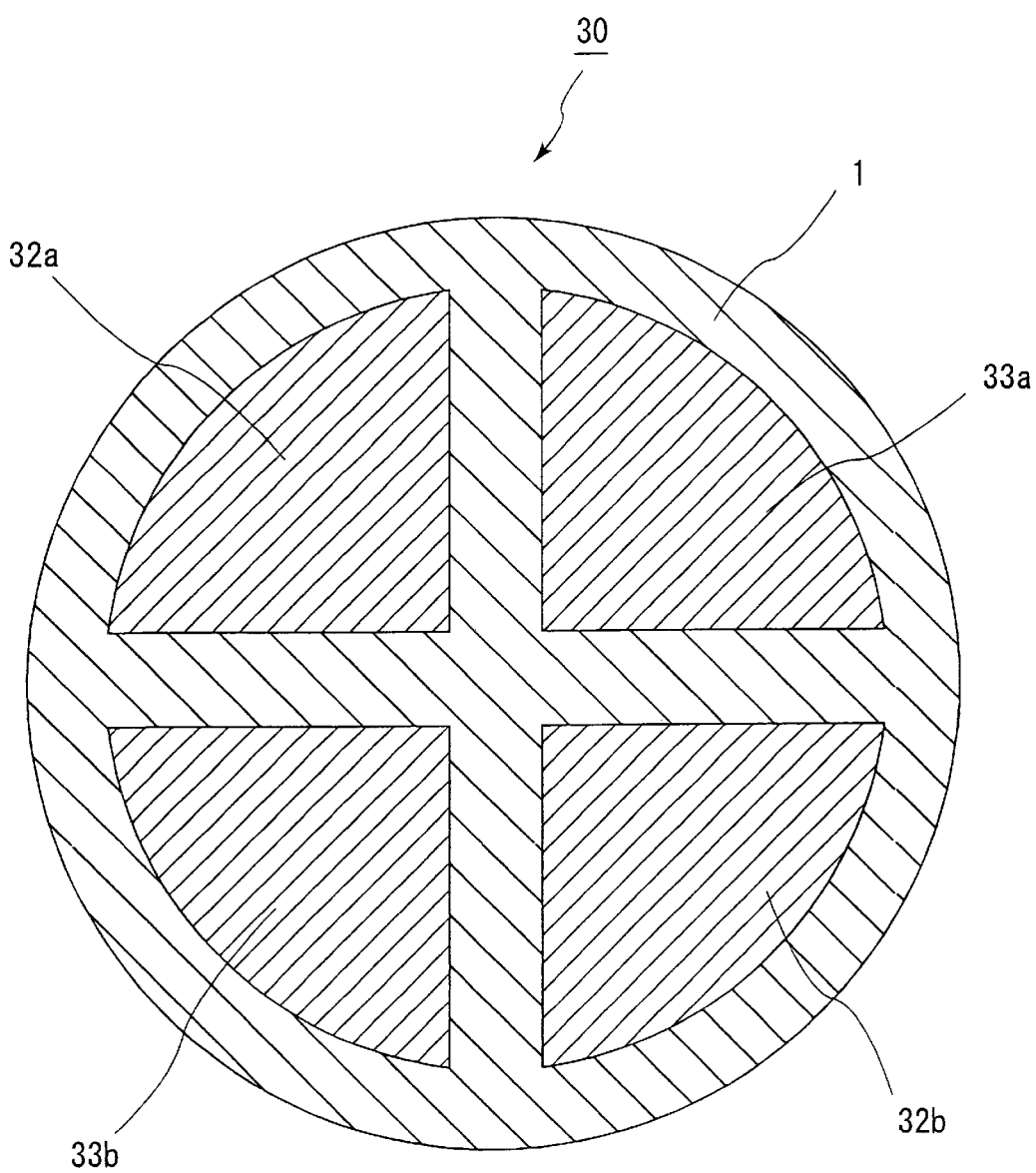
FIG. 9 is a horizontal sectional views schematically showing one example of electrostatic electrodes which constitute an electrostatic chuck according to the first and the second aspects of the present invention.

FIGS. 8 and 9 are horizontal sectional views schematically showing electrostatic electrodes in other types of electrostatic chuck. In the electrostatic chuck 20 shown in FIG. 8, a chuck positive electrostatic layer 22 and a chuck negative electrostatic layer 23 each having a semicircular shape are formed inside the ceramic substrate 1. In the electrostatic chuck shown in FIG. 9, a chuck positive electrostatic layer 32a, 32b and a chuck negative electrostatic layer 33a, 33b each having a form obtained by equally dividing a circle into four portions, are formed inside the ceramic substrate 1. The two chuck positive electrostatic layers 22a, 22b and two chuck negative electrostatic layer 33a, 33b are formed, such that the two chuck positive electrostatic layers 22a, 22b and the two chuck negative electrostatic layers 33a, 33b intersect each other.

The electrostatic chuck may be provided with RF electrodes, and the electrostatic electrodes may be provided on the both faces of the ceramic substrate.

In case that the electrostatic electrodes are formed such that the electrostatic electrodes have shapes which would be obtained by dividing a circular electrode into plural pieces, the number of the divided pieces is not particularly restricted and may be five or more, and the shape of the divided pieces is not restricted to a sector form, either.

In the electrostatic chuck according to the first aspect of the present invention, a temperature controlling means such as a resistance heating element is provided, as shown in FIG. 1. The temperature controlling means is provided, because tasks such as heating the silicon wafer set on the electrostatic chuck are required during the CVD processing and the like.

Examples of the above-mentioned temperature controlling means include a Peltier device (refer to FIG. 6), in addition to the resistance heating element 5 shown in FIG. 3. The resistance heating element may be provided either inside the ceramic substrate or on the bottom face of the ceramic substrate. In case that the resistance heating element is provided in the ceramic substrate, a coolant (such as air) outlet and the like as a cooling means may be provided in the supporting case in which the electrostatic chuck is fitted.

In case that the resistance heating element is provided inside the ceramic substrate, the resistance heating element may be provided in the form of a plurality of layers. In this case, it is preferable that the patterns at the layers are formed so that the patterns complement each other, whereby any portion of the heating face is covered by one of these patterns or layers without leaving any uncovered portion when viewed from the above. For example, a structure having a staggered arrangement may be used.

In case that the resistance heating element is set in the ceramic substrate, it is preferable that the resistance heating element is provided at a position which is within 60% of the ceramic substrate thickness as measured from the bottom face of the ceramic substrate, so that heat is well dissipated before reaching the heating face and the distribution of the temperature on the heating face is reliably made even.

Examples of the resistance heating element include a sintered body of metal or conductive ceramic, a metal foil, a metal wire and the like. As the metal sintered body, a metal sintered body which is produced by using at least one kind of element selected from tungsten and molybdenum is preferable, because these metals are relatively less likely to be oxidized and have a sufficient resistance value for generating heat.

As the conductive ceramic, at least one kind selected from carbides of tungsten and molybdenum can be preferably used.

Further, in case that the resistance heating element is formed on the bottom face of the ceramic substrate, it is preferable to use rare metal (gold, silver, palladium, platinum) or nickel for the metal sintered body. Specifically, silver, silver-palladium can be preferably used.

The shape of the metal particles used for producing the above-mentioned metal sintered body may be either spherical or scaly. In case that these metal particles are used, both spherical particles and scaly particles may be used in a mixed manner.

A metal oxide may be added to the metal sintered body. The above-mentioned metal oxide is used in order to tightly adhere the metal particles to the ceramic substrate. The reason why the above-mentioned metal oxide improves the adhesion of the metal particles to the ceramic substrate is not clearly known. But, a thin oxidized film is formed on the surface of the metal particle, and an oxidized film is also formed on the surface of the ceramic substrate, regardless of whether the ceramic substrate is oxide ceramic or non-oxide ceramic. It is thus assumed that the oxidized film of the metal particle and that of the ceramic substrate are combined to one film through the metal oxide when these oxidized films are sintered on the surface of the ceramic substrate, whereby the metal particles are closely adhered to the ceramic substrate.

As the above-mentioned metal oxide, at least one kind of compound selected from the group consisting of lead oxide, zinc oxide, silica, boron oxide ($B_2O_3$), alumina, yttria and titania is preferably used, because these oxides can improve adhesion of the metal particles to the ceramic substrate without increasing the resistance value of the resistance heating element.

The content of the metal oxide is preferably in a range of 0.1 parts by weight or more and less than 10 parts by weight with respect to 100 parts by weight of the metal particles. By using the metal oxide within the above-mentioned range, the adhesion between the metal particles and the ceramic substrate can be enhanced without increasing the resistance value too much.

The contents of lead oxide, zinc oxide, silica, boron oxide ($B_2O_3$), alumina, yttria and titania are preferably 1 to 10 parts by weight of lead oxide, 1 to 30 parts by weight of silica, 5 to 50 parts by weight of boron oxide, 20 to 70 parts by weight of zinc oxide, 1 to 10 parts by weight of alumina, 1 to 50 parts by weight of yttria and 1 to 50 parts by weight of titania, with respect to the whole weight of the metal oxides expressed as 100 parts by weight. However, it is preferable that these contents of the metal oxides are adjusted so that the total sum of the metal oxides does not exceed 100 parts by weight, because these metal oxides can especially enhance adhesion thereof to the ceramic substrate in such a range.

Figure 4:
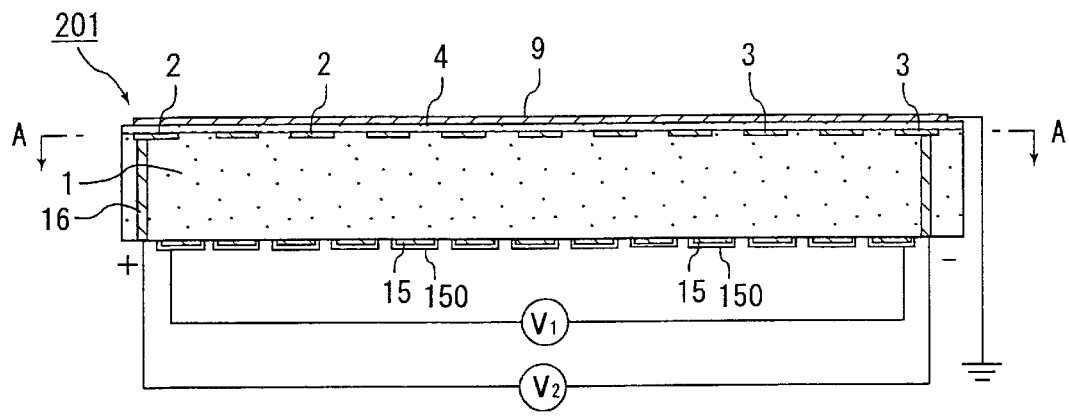
FIG. 4 is a longitudinal sectional view which schematically shows one example of an electrostatic chuck according to the first and the second aspects of the present invention.

In case that the resistance heating element is provided on the bottom face of the ceramic substrate, the surface of the resistance heating element 15 is preferably covered with a metal layer 150 (refer to FIG. 4). As the resistance heating element 15 is a sintered body of metal particles, the resistance heating element 15 is easily oxidized if it is exposed, and the resistance value thereof changes due to this oxidization. By covering the surface of the resistance heating element 15 with a metal layer 150, such oxidization can be prevented.

The thickness of the metal layer 150 is preferably in a range of 0.1 to 10 μm. When the thickness of the metal layer is within this range, the oxidization of the resistance heating element can be prevented without changing the resistance value of the resistance heating element.

The metal used for the metal layer for covering is not particularly limited, as long as the metal is non-oxidizable. Specific examples thereof include at least one element selected from the group consisting of gold, silver, palladium, platinum and nickel. Among these examples, nickel is more preferable. The resistance heating element requires a terminal for connecting itself to the power source, and this terminal is mounted to the resistance heating element by using solder. Nickel effectively prevents the heat dissipation caused by solder. As the connection terminal, a terminal pin made of Kovar can be used.

In case that the resistance heating element is formed inside the ceramic substrate, the surface of the resistance heating element is not oxidized and thus no covering by the metal layer is required. When the resistance heating element is formed inside the ceramic substrate, a portion of the surface of the resistance heating element may be exposed outside of the ceramic substrate.

In case that the ceramic substrate is produced by: filling ceramic powder and the like in a mold; producing a formed body; and firing the obtained formed body thereafter, the resistance heating element can be disposed by embedding a metal foil or a metal wire in the formed body.

Preferable examples of the metal foil used as the resistance heating element include a resistance heating element produced by conducting a pattern-forming process (such as etching) to nickel foil or stainless foil.

The metal foils which have been subjected to the pattern-forming process may be laminated with a resin film and the like.

Example of the metal wire include a tungsten wire, a molybdenum wire and the like.

In case that the Peltier device is used as the temperature controlling means, either heating or cooling can be performed by the same element by changing the flow direction of the current, which is advantageous.

Figure 6:
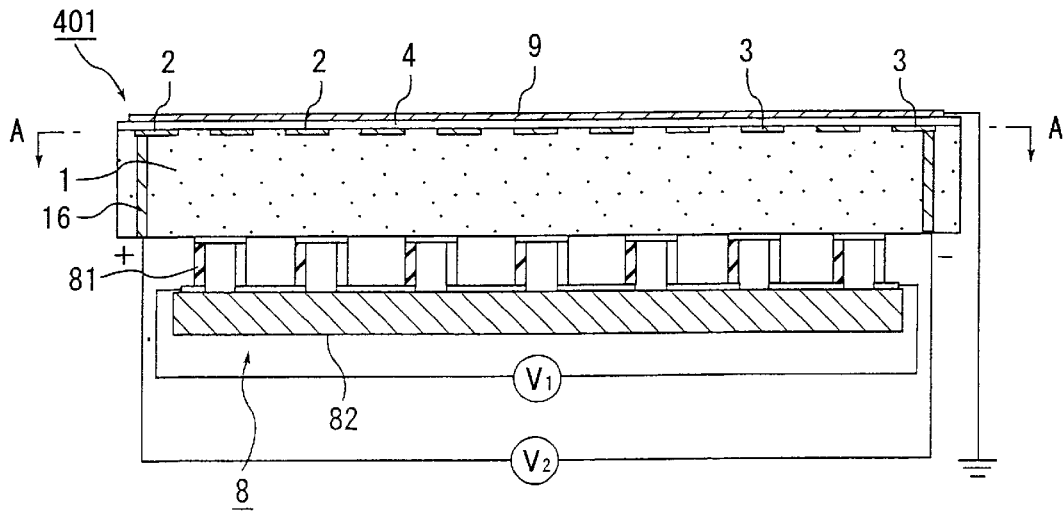
FIG. 6 is a longitudinal sectional view which schematically shows one example of an electrostatic chuck according to the first and the second aspects of the present invention.

The Peltier device 8 is formed by connecting p-type and n-type thermoelectric elements 81 in series and attaching these thermoelectric elements 81 to a ceramic plate 82 and the like, as shown in FIG. 6.

Examples of the Peltier device include the silicon/germanium-type Peltier device, the bismuth/antimony-type Peltier device, the lead/tellurium-type Peltier device and the like.

Figure 5:
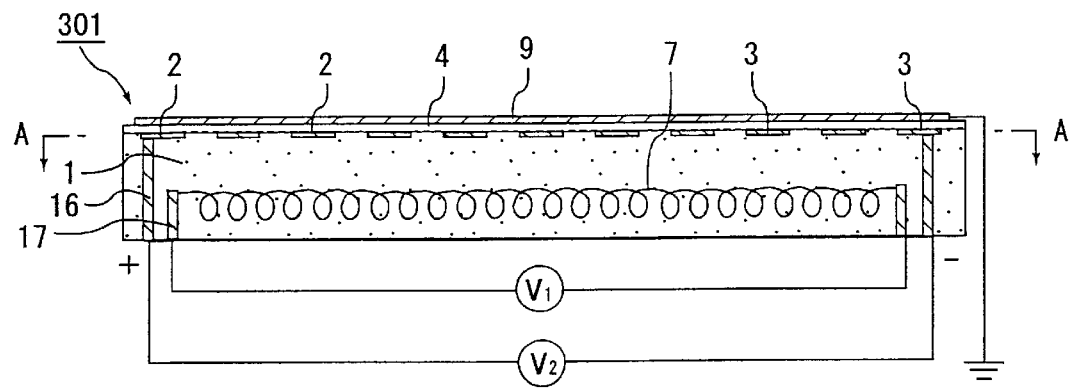
FIG. 5 is a longitudinal sectional view which schematically shows one example of an electrostatic chuck according to the first and the second aspects of the present invention.

Examples of the electrostatic chuck according to the first aspect of the present invention include: an electrostatic chuck 101 having a structure in which, as shown in FIG. 1, the chuck positive electrostatic layer 2 and the chuck negative electrostatic layer 3 are formed between the ceramic substrate 1 and the ceramic dielectric film 4 and the resistance heating element 5 is provided inside the ceramic substrate 1; an electrostatic chuck 201 having a structure in which, as shown in FIG. 4, the chuck positive electrostatic layer 2 and the chuck negative electrostatic layer 3 are formed between the ceramic substrate 1 and the ceramic dielectric film 4 and the resistance heating element 15 is provided on the bottom face of the ceramic substrate 1; an electrostatic chuck 301 having a structure in which, as shown in FIG. 5, the chuck positive electrostatic layer 2 and the chuck negative electrostatic layer 3 are formed between the ceramic substrate 1 and the ceramic dielectric film 4 and a metal wire 7 as a resistance heating element is embedded inside the ceramic substrate 1; and an electrostatic chuck 401 having a structure in which, as shown in FIG. 6, the chuck positive electrostatic layer 2 and the chuck negative electrostatic layer 3 are formed between the ceramic substrate 1 and the ceramic dielectric film 4 and a Peltier device 8 composed of a thermoelectric element 81 and a ceramic plate 82 is formed on the bottom face of the ceramic substrate 1; and the like.

In the first aspect of the present invention, as shown in FIGS. 1 to 5, the chuck positive electrostatic layer 2 and the chuck negative electrostatic layer 3 are provided between the ceramic substrate 1 and the ceramic dielectric film 4, and the resistance heating element 5 and the metal wire 7 are formed inside the ceramic substrate 1. As a result, connecting portions (conductor-filled through holes) 16, 17 for connecting these with the external terminals, are required. The conductor-filled through holes 16, 17 are formed by filling a metal having a high melting point such as tungsten paste and molybdenum paste or a conductive ceramic such as tungsten carbide and molybdenum carbide.

Here, the diameter of the connecting portions (conductor-filled through holes) 16, 17 is preferably in a range of 0.1 to 10 mm, because when the diameter of the connecting portions is within this range, not only occurrence of disconnection of the wires but also generation of cracks or strains can be prevented.

Figure 7:
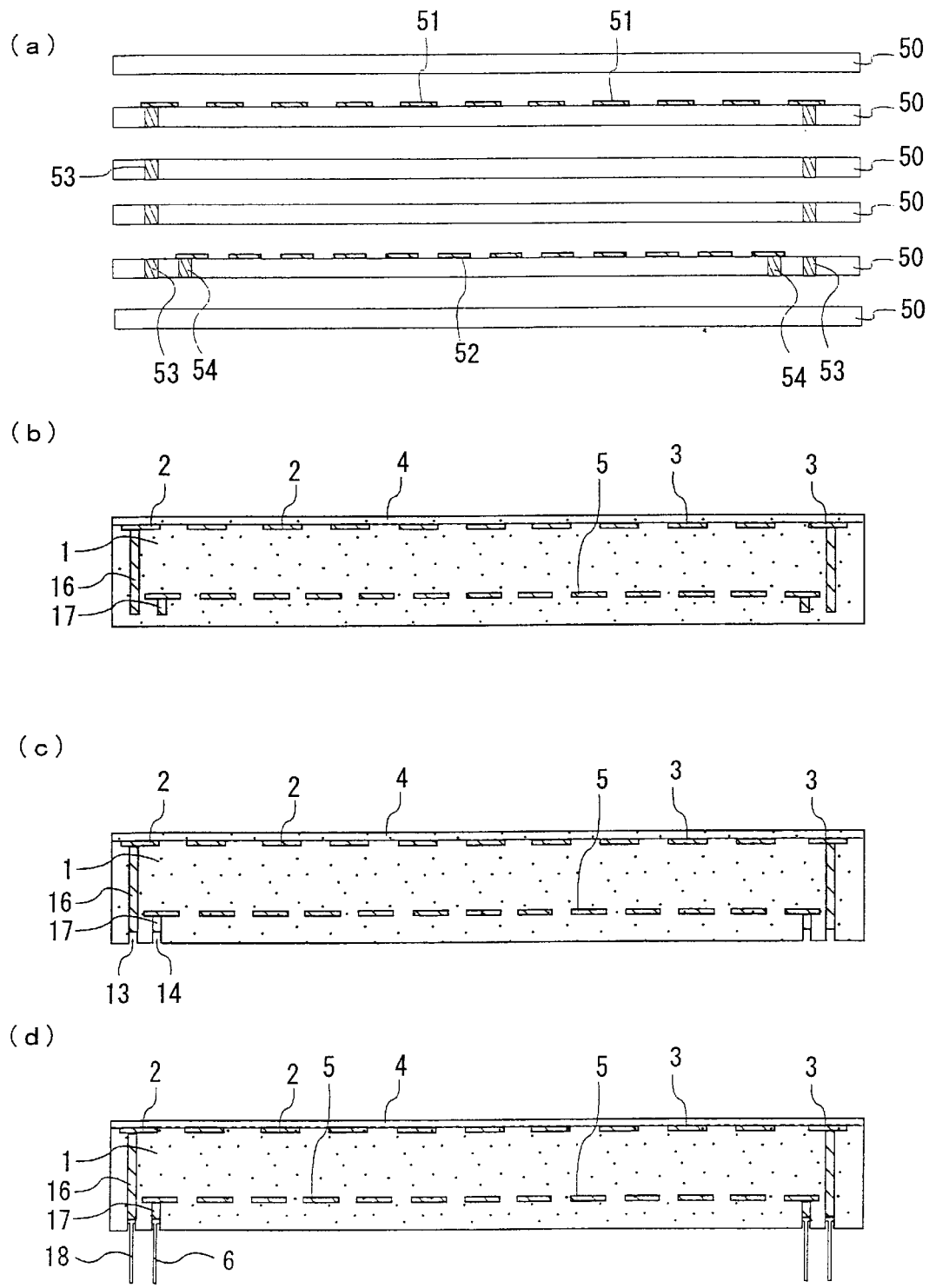
FIGS. 7(a) to (d) are longitudinal sectional views which schematically shows some steps of the production process of an electrostatic chuck according to the first and the second aspects of the present invention.

External terminals 6, 18 are connected thereto, by using the conductor-filled through holes as connection pads (refer to FIG. 7(*d*)).

Such connection is performed by using solder or brazing filler metal. As the brazing filler metal, silver braze, palladium braze, aluminum braze and gold braze are preferable. As the gold braze, Au—Ni alloy is preferable because Au—Ni alloy exhibits excellent adhesion property to tungsten.

The ratio of Au/Ni is preferably [81.5 to 82.5 (weight %)]/[18.5 to 17.5 (weight %)].

The thickness of the Au—Ni layer is preferably in a range of 0.1 to 50 μm, because the connection property is reliably obtained when the thickness of the Au—Ni layer is within this range. In the case of Au—Cu alloy, the alloy exhibits deterioration when used in a highly vacuumed state of $10^{-6}$ to $10^{-5}$ Pa at a high temperature in a range of 500 to 1000° C. On the other hand, the Au—Ni alloy does not exhibit deterioration when the alloy is used in such a harsh condition, which is advantageous. The content of the impurity elements contained in the Au—Ni alloy is preferably less than 1 parts by weight when the whole weight of the Au—Ni alloy is expressed as 100 parts by weight.

In the first aspect of the present invention, a thermocouple maybe embedded in the bottomed hole 12 of the ceramic substrate 1, according to necessity. In this arrangement, the temperature of the resistance heating element can be measured by the thermocouple, so that the temperature of the resistance heating element can be controlled by changing the voltage and the current amount on the basis of the obtained data.

The size of the connecting portion of the metal wire of the thermocouple is preferably the same as or larger than the strand diameter of each metal wire, but 0.5 mm or less. The heat capacity of the connecting portion is made small by such a structure, whereby the temperature is converted into correctly and rapidly into the current value. As a result, the temperature controlling property is improved, whereby the temperature distribution on the heating face of the wafer is kept small.

Examples of the above-mentioned thermocouple include the K-type, the R-type, the B-type, the S-type, the E-type, the J-type and the T-type thermocouples, as are raised in JIS-C-1602 (1980).

Figure 10:
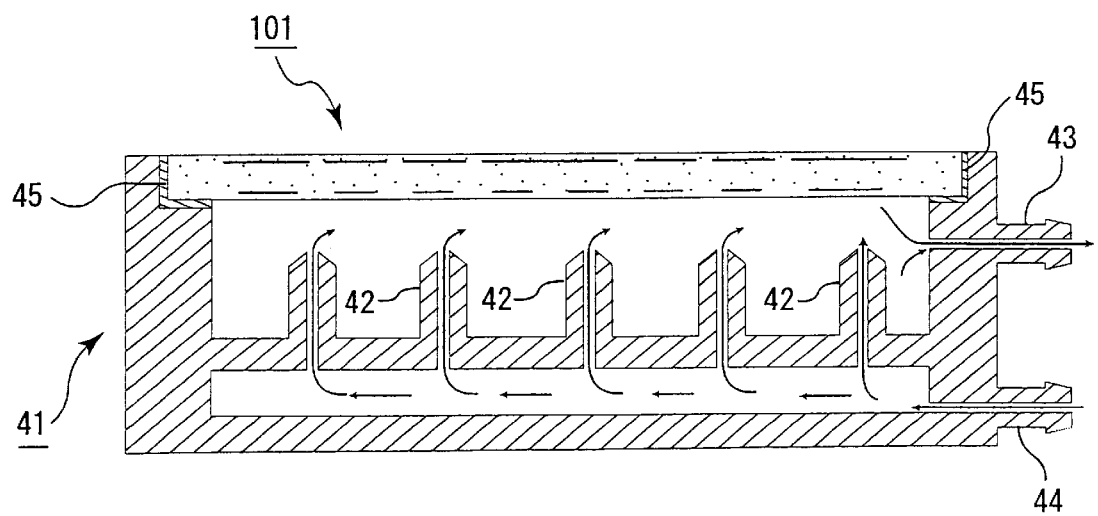
FIG. 10 is a sectional views which schematically shows an electrostatic chuck according to the first and the second aspects of the present invention in a state in which the electrostatic chuck is fixed in a supporting case.

FIG. 10 is a sectional view which schematically shows a supporting case 41 in which the electrostatic chuck having a structure as described above according to the first aspect of the present invention is fitted.

The supporting case 41 is designed such that the electrostatic chuck 101 is fitted therein through a heat insulator 45. In the supporting case 41, coolant outlets 42 are formed such that the coolant introduced from a coolant inlet 44 is discharged outside from an inhalation duct 43 through the coolant outlet 42. By the action of this coolant, the electrostatic chuck 101 can be cooled.

The supporting case may be structured such that the ceramic substrate, which has been set on the upper surface of the supporting case, is fixed to the supporting case by the fixing member like bolts.

The electrostatic chuck according to the first aspect of the present invention is preferably used in a temperature range of 100 to 800° C.

Next, one example of the method of producing the electrostatic chuck according to the first aspect of the present invention will be described with reference to the sectional views shown in FIGS. 7(*a*) to (*d*).

(1) First, a green sheet 50 is produced by: preparing powder of ceramic such as oxide ceramic, nitride ceramic and carbide ceramic, (powder of nitride or carbide ceramic is fired in an oxidizing atmosphere so that the ceramic powder contains oxygen) mixing the ceramic powder with an auxiliary agent, a binder, a solvent and the like, thereby preparing a paste; and forming the paste in a sheet-like form by the doctor blade method and the like, thereby producing a green sheet 50.

As the above-mentioned ceramic powder, aluminum nitride, silicon carbide and the like may be used, for example. Further, a sintering aid such as yttria and carbon may further be added thereto, according to necessity.

One or plurality of the green sheet 50, which is laminated on the green sheet having an electrostatic electrode layer printed body 51 formed thereon, described below, is the layer which serves as the ceramic dielectric film 4.

In general, it is preferable that the same raw material is used for the ceramic dielectric film 4 and the ceramic substrate 1, because then the same preferable firing conditions can be applied to both the ceramic dielectric film 4 and the ceramic substrate 1 during the firing process thereof since normally, the ceramic dielectric film 4 and the ceramic substrate 1 are sintered together in the integrated arrangement. In case that different raw materials are used for the ceramic dielectric film 4 and the ceramic substrate 1, the ceramic substrate may be produced first, so that the electrostatic electrode layer is formed thereon and the ceramic dielectric film is further provided on the electrostatic electrode layer.

Examples of the binder which is generally used for the production of an electrostatic chuck include an acrylic binder, an ethyl cellulose, a butyl cellosolve and polyvinyl alcohol and the like. At least one kind of binder selected from the above-mentioned group can be used as the binder for forming the ceramic substrate.

As the solvent, at least one kind of solvent selected from α-terpineol and glycol is preferably used.

A through hole which a lifter pin of the silicon wafer is pushed through and a concave portion in which thermocouple is embedded may be optionally formed in the green sheet 50. The through hole and the concave portion can be formed by punching and the like.

The thickness of the green sheet 50 is preferably in a range of 0.1 to 5 mm.

Next, the conductor containing paste which is to serve as the electrostatic electrode layer or the resistance heating element is printed on the green sheet 50.

The printing is performed, in consideration of the shrinking rate of the green sheet 50, so that a desirable aspect ratio is obtained. As a result, the electrostatic electrode layer printed body 51 and the resistance heating element layer printed body 52 are obtained.

The printed body is formed by printing the conductor containing paste which contains conductive ceramic, metal particles and the like on the green sheet.

As the conductive ceramic particles contained in the conductor containing paste, a carbide of tungsten or molybdenum is the most preferable because such a carbide is less likely to be oxidized and the heat conductivity thereof is less likely to drop, as compared with other materials.

Examples of the metal particle include particles of tungsten, molybdenum, platinum, nickel and the like.

The average particle diameter of the conductive ceramic particles and the metal particles is preferably in a range of 0.1 to 5 μm. If the particle size is too large or small, it is difficult to effect printing with such a conductor containing paste.

As such a conductor containing paste used for the present invention, a conductor containing paste which is prepared by mixing: 85 to 97 parts by weight of metal particles or conductive ceramic particles; 1.5 to 10 parts by weight of at least one kind of binder selected from the group consisting of an acrylic binder, an ethyl cellulose, a butyl cellosolve and polyvinyl alcohol; 1.5 to 10 parts by weight of at least one kind of solvent selected from α-terpineol, glycol, ethyl alcohol and butanol, is most preferably used.

The conductor containing paste is filled in holes formed by punching and the like, whereby the conductor-filled through hole printed bodies 53, 54 are obtained.

Next, as shown in FIG. 7(a), green sheets 50 having the printed bodies 51, 52, 53, 54 are laminated with the green sheet 50 having no printed body thereon. Several of one of the green sheet(s) 50 with the above-mentioned structure are/is laminated on the green sheet on which the electrostatic electrode layer printed body 51 has been formed. The reason why the green sheet 50, which does not have the printed bodies at the side on which the resistance heating element is formed, is laminated as described above, is prevent the end surface of the conductor-filled through hole from exposing and being oxidized during firing when the resistance heating element is formed. If the firing is to be performed, when the resistance heating element is formed, in a state in which the end surface of the conductor-filled through hole is exposed, a metal such as nickel which is less likely to be oxidized needs to be provided therein by spattering. More preferably, the end surface of the conductor-filled through hole may be covered by a gold braze of Au—Ni.

(2) Next, as shown in FIG. 7(b), the lamination is subjected to heating and pressurizing, whereby the green sheet and the conductor containing paste are sintered.

The heating temperature is preferably in a range of 1000 to 2000° C. The pressure for pressurizing is preferably within a range of 100 to 200 kg/cm$^2$. Heating is performed and pressuring is conducted in an inactive gas atmosphere. As the inactive gas, argon, nitrogen and the like may be used, for example. In this process, the conductor-filled through holes 16, 17, the chuck positive electrostatic layer 2, the chuck negative electrostatic layer 3, the resistance heating element 5 and the like are formed.

(3) Next, as shown in FIG. 7(c), blind holes 13, 14 for connecting external terminals are formed.

It is preferable that at least a portion of the inner walls of the blind holes 13, 14 are made conductive and the conductive inner walls are connected to the chuck positive electrostatic layer 2, the chuck negative electrostatic layer 3, the resistance heating element 5 and the like.

(4) Finally, as shown in FIG. 7(d), the external terminals 6, 18 are provided to the blind holes 13, 14 by way of a brazing filler material such as gold braze and the like. In addition, a bottomed hole 12 may optionally be formed so that themocouple can be embedded therein.

As solder, alloys of silver-lead, lead-tin, bismuth-tin and the like can be used. The thickness of the solder is preferably in a range of 0.1 to 50 μm. When the thickness of the solder is within this range, connection by the solder is reliably conducted in a sufficient manner.

In the above-mentioned example, the electrostatic chuck 101 (refer to FIG. 1) has been described. In case that the electrostatic chuck 201 (refer to FIG. 4) is to be produced, a ceramic substrate having an electrostatic electrode layer is first produced, the conductor containing paste is then printed on the bottom face of the ceramic substrate, firing is effected to form a resistance heating element 15, and thereafter a metal layer 150 is formed by electroless plating and the like. In case that the electrostatic chuck 301 (refer to FIG. 5) is to be produced, a metal foil and a metal wire as the electrostatic electrode and the resistance heating element are embedded in the ceramic powder, at the time of filling the ceramic powder (granules) in a mold or the like and forming a formed body. The electrostatic chuck 301 can be produced by sintering the obtained formed body.

Further, in case that the electrostatic chuck 401 (refer to FIG. 6) is to be produced, a ceramic substrate having an electrostatic electrode layer is produced and then a Peltier element is joined to the ceramic substrate by way of a thermal spraying of metal layer and the like.

Next, an electrostatic chuck according to the second aspect of the present invention will be described hereinafter.

The second aspect of the present invention is an electrostatic chuck comprising: a ceramic substrate equipped with a temperature controlling means; an electrostatic electrode formed on the ceramic substrate; and a ceramic dielectric film provided on the electrostatic electrode, wherein the ceramic substrate has a diameter exceeding 300 mm and a thickness of 20 mm or less.

FIGS. 1 to 10 schematically show one example of the embodiment according to the second aspect of the present invention.

The ceramic substrate which constitutes the electrostatic chuck according to the second aspect of the present invention has diameter exceeding 300 mm, so that the ceramic substrate can adapt to silicon wafers of larger size and reliably cope with the semiconductor wafers of the next generation.

The thickness of the above-mentioned ceramic substrate is set to be 20 mm or less, and desirably 10 mm or less. This is to reduce the heat capacity of the ceramic substrate by the decrease in thickness of the ceramic substrate so as to cope with the enlargement of the size of the electrostatic chuck. In a case of a ceramic substrate whose diameter exceeding 300 mm, the area of the periphery is relatively large i.e., the area of the portion at which the ceramic substrate is brought into contact with an atmospheric gas such as air is relatively large, whereby the temperature drops significantly at the peripheral portion of the ceramic substrate. Therefore, in the present invention, the area of the portion at which the ceramic substrate is brought into contact with air is decreased by reducing the thickness of the ceramic substrate, so that the temperature dropping at the peripheral portion can be prevented.

As the structures of the ceramic substrate, the ceramic dielectric film, the resistance heating element, the thermocouple and the like of the electrostatic chuck according to the second aspect of the present invention are basically the same as those of the electrostatic chuck according to the first aspect of the present invention, the detailed description of the electrostatic chuck according to the second aspect of the present invention will be omitted.

Further, regarding the method of producing the electrostatic chuck of the second aspect of the present invention, the method is basically the same as the method of producing the electrostatic chuck of the first aspect of the present invention, except that the diameter of the ceramic substrate is designed so as to exceed 300 mm and the ceramic dielectric film preferably contains oxygen in an amount of 0.1 to 20 weight %. Therefore, the detailed description thereof will be omitted.

BEST MODE FOR CARRYING OUT THE PRESENT INVENTION

The present invention will be described further in detail hereinafter.

EXAMPLE 1

Production of the Electrostatic Chuck (Refer to FIG. 1)

(1) A paste was produced by mixing: 100 parts by weight of aluminum nitride powder (manufactured by Tokuyama co., the average particle diameter: 1.1 μm); 4 parts by weight of yttria (the average particle diameter: 0.4 μm); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet having a thickness of 0.47 mm was obtained.

(2) Next, the green sheet was dried for five hours at 80° C. Thereafter, portions which were to serve as through holes through which lifter pins for the semiconductor wafer are inserted, with a diameter thereof being 1.8 mm, 3.0 mm and 5.0 mm, respectively and portions which was to serve as a conductor-filled through hole for effecting connection with the external terminal, were formed by punching.

(3) A conductor containing paste A was prepared by mixing: 100 parts by weight of tungsten carbide particles whose average particle diameter was 1 μm; 3.0 parts by weight of an acrylic binder; 3.5 parts by weight of α-terpineol solvent; and 0.3 parts by weight of a dispersant.

A conductor containing paste B was prepared by mixing: 100 parts by weight of tungsten particles whose average particle diameter was 3 μm; 1.9 parts by weight of an acrylic binder; 3.7 parts by weight of α-terpineol solvent; and 0.2 parts by weight of a dispersant.

The conductor containing paste A was printed on the green sheet by screen printing, whereby a conductor containing paste layer was formed. The printing pattern was the pattern of concentric circles. Further, a conductor containing paste layer, which had the pattern of the electrostatic electrodes as shown in FIG. 2, was formed by screen printing on another green sheet.

Further, the conductor containing paste B was filled in the through hole for the conductor-filled through hole provided for effecting connection to the external terminals.

The green sheet 50, which had been subjected to the above-mentioned treatment, was further laminated with: 34sheets of the green sheet 50 on which the tungsten paste had not been printed, provided at the upper side thereof (on the heating face thereof); and 13 sheets of the green sheet 50 on which the tungsten paste had not been printed, provided at the lower side thereof. The green sheet 50 on which a conductor containing paste layer had been printed in the pattern of the electrostatic electrodes was further laminated on the lamination. A green sheet 50 on which the tungsten paste had not been printed was further laminated on the above-mentioned laminated structure. The resulting structure was pressed for adhesion at 130° C. and at a pressure of 80 kg/cm , whereby a lamination was formed (refer to FIG. 7(a)).

(4) Next, the obtained lamination was degreased in nitrogen gas at 600° C. for 5 hours and then hot-pressed for 3 hours at 1890° C. and at a pressure of 150 kg/cm$^2$, whereby a plate-formed body of aluminum nitride having a thickness of 3 mm was obtained. This plate-formed body of aluminum nitride was cut out so as to have a disc-like shape having a diameter of 210 mm, whereby a plate-formed body of aluminum nitride having a resistance heating element 5 whose thickness was 6 μm and width was 10 mm, a chuck positive electrostatic layer 2 and a chuck negative electrostatic layer 3 (whose thickness was 10 μm, respectively) inside thereof was obtained (refer to FIG. 7(b)).

The thickness of the ceramic dielectric film was 500 μm.

(5) Next, the plate-formed body obtained in the above-mentioned (4) was ground by using a diamond grindstone. Thereafter, a mask was set thereon and a bottomed hole (diameter: 1.2 mm, depth: 2.0 mm) for embedding a thermocouple was formed on the surface thereof by the blasting treatment using SiC and the like.

(6) Further, blind holes 13, 14 were each formed by hollowing out a portion at which the conductor-filled through hole was formed (refer to FIG. 7(c)). External terminals 6, 18 made of Kovar were connected to the blind holes 13, 14, respectively, by using gold brazing of Ni—Au and heating and reflowing at 700° C. (refer to FIG. 7(d)).

It is preferable that the connection of the external terminals is effected by a structure wherein the external terminal is supported by the support of tungsten at three portions. The external terminals can be reliably connected to the bind holes in such a structure.

(7) Next, a plurality of thermocouples for controlling the temperature was embedded in the bottomed hole, whereby the production of the electrostatic chuck having a resistance heating element was completed.

EXAMPLE 2

Production of an Electrostatic Chuck (Refer to FIG. 4)

(1) A paste was produced by mixing: 100 parts by weight of aluminum nitride powder (manufactured by Tokuyama co., the average particle diameter: 1.1 μm); 4 parts by weight of yttria (the average particle diameter: 0.4 μm); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet having a thickness of 0.47 mm was obtained.

(2) Next, the green sheet was dried for five hours at 80° C. Thereafter, portions which were to serve as through holes through which lifter pins for the semiconductor wafer are inserted, with a diameter thereof being 1.8 mm, 3.0 mm and 5.0 mm, respectively and a portion which was to serve as a conductor-filled through hole for effecting connection with the external terminal, were formed by punching.

(3) A conductor containing paste A was prepared by mixing: 100 parts by weight of tungsten carbide particles whose average particle diameter was 1 μm; 3.0 parts by weight of an acrylic binder; 3.5 parts by weight of (α-terpineol solvent; and 0.3 parts by weight of a dispersant A conductor containing paste B was prepared by mixing: 100 parts by weight of tungsten particles whose average particle diameter was 3 μm; 1.9 parts by weight of an acrylic binder; 3.7 parts by weight of α-terpineol solvent; and 0.2 parts by weight of a dispersant.

The conductor containing paste A was printed on the green sheet by screen printing, whereby a conductor containing paste layer which had a pattern of electrostatic electrodes as shown in FIG. 9 was formed on the green sheet.

Further, the conductor containing paste B was filled in the through hole for the conductor-filled through hole provided for effecting connection to the external terminals.

The green sheet 50 which had been subjected to the above-mentioned treatment was laminated with 2 sheets of the green sheet 50 on which the tungsten paste had not been printed, provided at the upper side thereof (on the heating face thereof) and 48 sheets of the green sheet 50 on which the tungsten paste had not been printed, provided at the lower side thereof. The resulting structure was pressed for adhesion at 130° C. and at a pressure of 80 kg/cm, whereby a lamination was formed.

(4) Next, the obtained lamination was degreased in nitrogen gas at 600° C. for 5 hours and then hot-pressed for 3 hours at 1890° C. and at a pressure of 150 kg/cm, whereby a plate-formed body of aluminum nitride having a thickness of 5 mm was obtained. This plate-formed body of aluminum nitride was cut out so as to have a disc-like shape having a diameter of 210 mm, whereby a plate-formed body of aluminum nitride having a chuck positive electrostatic layer 2 and a chuck negative electrostatic layer 3 whose thickness were 15 $\mu$m, respectively inside thereof was obtained. The thickness of the ceramic dielectric film was 1000 $\mu$m.

(5) Next, a mask was set on the bottom face of the plate-formed body obtained in the above-mentioned (4) and a concave portion (not shown) and the like for embedding a thermocouple was formed on the surface by the blasting treatment using SiC and the like.

(6) Next, a conductor containing paste for forming a resistance heating element was printed on the surface (the bottom face) opposite to the wafer putting surface, whereby a printed body for a resistance heating element 15 was formed. As the conductor containing paste, "SOLVEST PS603D" manufactured by Tokuriki Kagaku Kenkyujo, which is used for forming a plated through hole of a printed circuit board, was employed. This conductor containing paste was a silver-lead paste and contained 7.5 parts by weight, per 100 parts by weight of silver, of metal oxides comprising lead oxide, zinc oxide, silica, boron oxide and alumina (the weight ratio thereof being 5/55/10/25/5). The average particle diameter of the silver particles was 4.5 $\mu$m and the shape of the silver particles was scaly.

(7) The plate-formed body on which the conductor containing paste had been printed was heated and fired at 780° C., so that the silver and lead contained in the conductor containing paste were sintered and baked on the ceramic substrate. The plate-formed body was immersed in an electroless nickel plating bath containing an aqueous solution of nickel sulfate (30 g/L) boric acid (30 g/L), ammonium chloride (30 g/L) and Rochelle salt (60 g/L), so that a nickel layer 150 of 1 $\mu$m thickness whose boron content was 1 weight % or less was deposited on the surface of the silver sintered body 15. Thereafter, the plate-formed body was subjected to the annealing treatment at 120° C. for 3 hours.

The thickness of the resistance heating element composed of the silver sintered body was 5 $\mu$m, the width thereof was 2.4 mm and the sheet resistivity was 7.7 m$\Omega$/□.

(8) Next, a blind hole for exposing the conductor-filled through hole 16 was formed in the ceramic substrate. An external terminal pin made of Kovar was connected to the blind hole by using gold brazing of Ni—Au alloy (Au: 81.5 weight %, Ni: 18.4 weight % and impurities: 0.1 weight %) and heating and reflowing at 970° C. Further, an external terminal pin made of Kovar was formed at the resistance heating element by way of solder (tin: 9/lead:1).

(9) Next, a plurality of thermocouples for controlling the temperature was embedded in the concave portion, whereby the electrostatic chuck 201 was obtained.

(10) Next, the electrostatic chuck 201 was fitted in a supporting case 41 made of stainless steel having a sectional shape as shown in FIG. 10 through a heat insulator 45 comprising ceramic fiber (manufactured by Ibiden co. under the trademark of "Ibiwool") The supporting case 41 has a coolant outlet 42 of cooling gas, so that the temperature of the electrostatic chuck 201 can be adjusted.

The resistance heating element 15 of the electrostatic chuck 201 fitted in the supporting case 41 was energized in order to raise the temperature of the electrostatic chuck and also, the coolant was flowed through the supporting case, so that the temperature of the electrostatic chuck 201 was controlled. The temperature control was very excellently performed.

EXAMPLE 3

Production of the Electrostatic Chuck 301 (FIG. 5)

(1) Two electrodes having shapes shown in FIG. 8 were formed by punching a tungsten foil having a thickness of 10 $\mu$m.

These two electrodes and tungsten wires were set in a mold, together with 100 parts by weight of aluminum nitride powder (manufactured by Tokuyama co., the average particle diameter: 1.1 $\mu$m) and 4 parts by weight of yttria (the average particle diameter: 0.4 $\mu$m), and were hot-pressed in nitrogen gas for 3 hours at 1890° C. and at a pressure of 150 kg/cm$^2$, whereby a plate-formed body of aluminum nitride having a thickness of 10 mm was obtained. This plate-formed body of aluminum nitride was cut out so as to have a disc-like shape having a diameter of 250 mm, whereby a disc-shaped plate formed body was obtained. Here, the thickness of the electrostatic electrode layer was 10 $\mu$m. The thickness of the ceramic dielectric film was 2000 $\mu$m.

(2) This plate formed body was subjected to the processing steps of the above-mentioned (5) to (7) of example 1, whereby the electrostatic chuck 301 was obtained.

EXAMPLE 4

Production of the Electrostatic Chuck 401 (FIG. 6)

By carrying out the processing steps of the above-mentioned (1) to (5) of example 2, a plate-formed body of aluminum nitride having a thickness of 14 mm was obtained. Thereafter, nickel was thermal sprayed to the bottom face of the plate-shaped aluminum nitride and then a lead-tellurium type Peltier element was joined thereto, whereby the electrostatic chuck 401 was obtained.

The thickness of the ceramic dielectric film was 2500 $\mu$m.

Comparative examples 1 to 5

In each of comparative examples 1 to 4, an electrostatic chuck was produced in a manner similar to that of examples 1 to 4, respectively, except that the thickness of the ceramic substrate was 25 mm. Comparative example 5 was carried out in a manner similar to that of example 1, except that the diameter and the thickness of the ceramic substrate were 190 mm and 25 mm, respectively

Comparative Example 6

Comparative example 6 was carried out in a manner similar to that of example 1, except that 2 parts by weight of yttria (the average particle diameter: 0.4 $\mu$m) was added.

Comparative Example 7

Comparative example 7 was carried out in a manner similar to that of example 1, except that the aluminum nitride powder as the raw material was heated for 3 hours so that oxygen was introduced thereto.

EXAMPLE 5

Electrostatic Chuck (1) A paste was produced by mixing: 100parts by weight of aluminum nitride powder (manufactured by Tokuyama co., the average particle diameter: 1.1 $\mu$m); 4 parts by weight of yttria (the average particle diameter: 0.4 $\mu$m); 11.5 parts by weight of acrylic binder; 0.5parts by weight of a dispersant; and 53 parts by weight of alcohol comprising 1-butanol and ethanol. By using the obtained paste and performing the forming process according to the doctor blade method, a green sheet having a thickness of 0.47 mm was obtained.

(2) Next, the green sheet was dried for five hours at 80° C. Thereafter, portions which were to serve as through holes through which lifter pins for the semiconductor wafer are inserted, with a diameter thereof being 1.8 mm, 3.0 mm and 5.0 mm, respectively and a portion which was to serve as a conductor-filled through hole for effecting connection with the external terminal, were formed by punching.

(3) A conductor containing paste A was prepared by mixing: 100 parts by weight of tungsten carbide particles whose average particle diameter was 1 $\mu$m; 3.0 parts by weight of an acrylic binder; 3.5 parts by weight of α-terpineol solvent; and 0.3 parts by weight of a dispersant.

A conductor containing paste B was prepared by mixing: 100 parts by weight of tungsten particles whose average particle diameter was 3 $\mu$m; 1.9 parts by weight of an acrylic binder; 3.7 parts by weight of α-terpineol solvent; and 0.2 parts by weight of a dispersant.

The conductor containing paste A was printed on the green sheet by screen printing, whereby a conductor containing paste layer was formed. The printing pattern was the pattern of concentric circles. Further, a conductor containing paste layer, which had the pattern of the electrostatic electrodes as shown in FIG. 2, was formed by screen printing on another green sheet.

Further, the conductor containing paste B was filled in the through hole for the conductor-filled through hole provided for effecting connection to the external terminals.

The green sheet 50, which had been subjected to the above-mentioned treatment, was further laminated with: 34 sheets of the green sheet 50 on which the tungsten paste had not been printed, provided at the upper side thereof (on the heating face thereof); and 13 sheets of the green sheet 50 on which the tungsten paste had not been printed, provided at the lower side thereof. A green sheet 50, on which a conductor containing paste layer had been printed in the pattern of the electrostatic electrodes, was further laminated on the laminated structure. A green sheet 50 on which the tungsten paste had not been printed was yet further laminated on the above-mentioned laminated structure. The resulting structure was pressed for adhesion at 130° C. and at a pressure of 80 kg/cm$^2$, whereby a lamination was formed (refer to FIG. 7(*a*)).

(4) Next, the obtained lamination was degreased in nitrogen gas at 600° C. for 5 hours and then hot-pressed for 3 hours at 1890° C. and at a pressure of 150 kg/cm$^2$, whereby a plate-formed body of aluminum nitride having a thickness of 3 mm was obtained. This plate-formed body of aluminum nitride was cut out so as to have a disc-like shape having a diameter of 310 mm, whereby a plate-formed body of aluminum nitride having a resistance heating element 5 whose thickness was 6 $\mu$m and width was 10 mm, a chuck positive electrostatic layer 2 and a chuck negative electrostatic layer 3 (whose thickness was 10 $\mu$m, respectively) inside thereof was obtained (refer to FIG. 7(*b*)). The thickness of the ceramic dielectric film was 500 $\mu$m.

(5) Next, the plate-formed body obtained in the above-mentioned (4) was ground by using a diamond grindstone. Thereafter, a mask was set thereon and a bottomed hole (diameter: 1.2 mm, depth: 2.0 mm) for embedding a thermocouple was formed on the surface by the blasting treatment using SiC and the like.

(6) Further, blind holes 13, 14 were each formed by hollowing out a portion at which the conductor-filled through hole was formed (refer to FIG. 7(*c*)). External terminals 6, 18 made of Kovar were connected to the blind holes 13, 14, respectively, by using gold brazing of Ni—Au and heating and reflowing at 700° C. (refer to FIG. 7(*d*)).

It is preferable that the connection of the external terminals is effected by a structure wherein the external terminal is supported by the support of tungsten at three portions. The external terminals can be reliably connected to the blind holes in such a structure.

(7) Next, a plurality of thermocouples for controlling the temperature was embedded in the bottomed hole, whereby the production of the electrostatic chuck having a resistance heating element was completed.

EXAMPLE 6

Production of an Electrostatic Chuck (Refer to FIG. 4)

(1) A paste was produced by mixing: 100parts by weight of aluminum nitride powder (manufactured by Tokuyama co., the average particle diameter: 1.1 $\mu$m); 4 parts by weight of yttria (the average particle diameter: 0.4 $\mu$m); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet having a thickness of 0.47 mm was obtained.

(2) Next, the green sheet was dried for five hours at 80° C. Thereafter, portions which were to serve as through holes through which lifter pins for the semiconductor wafer are inserted, with a diameter thereof being 1.8 mm, 3.0 mm and 5.0 mm, respectively and a portion which was to serve as a conductor-filled through hole for effecting connection with the external terminal, were formed by punching.

(3) A conductor containing paste A was prepared by mixing: 100 parts by weight of tungsten carbide particles whose average particle diameter was 1 $\mu$m; 3.0 parts by weight of an acrylic binder; 3.5 parts by weight of α-terpineol solvent; 0.3 parts by weight of a dispersant.

A conductor containing paste B was prepared by mixing: 100 parts by weight of tungsten particles whose average particle diameter was 3 $\mu$m; 1.9 parts by weight of an acrylic binder; 3.7 parts by weight of α-terpineol solvent; 0.2 parts by weight of a dispersant.

The conductor containing paste A was printed on the green sheet by screen printing, whereby a conductor containing paste layer which had a pattern of electrostatic electrodes as shown in FIG. 9 was formed on the green sheet.

Further, the conductor containing paste B was filled in the through hole for the conductor-filled through hole provided for effecting connection to the external terminals.

The green sheet 50 which had been subjected to the above-mentioned treatment was laminated with 2 sheets of the green sheet 50 on which the tungsten paste had not been printed, provided at the upper side thereof (on the heating face thereof) and 48 sheets of the green sheet 50 on which the tungsten paste had not been printed, provided at the lower side thereof. The resulting structure was pressed for adhesion at 130° C. and at a pressure of 80 kg/cm, whereby a lamination was formed.

(4) Next, the obtained lamination was degreased in nitrogen gas at 600° C. for 5 hours and then hot-pressed for 3 hours at 1890° C. and at a pressure of 150 kg/cm, whereby a plate-formed body of aluminum nitride having a thickness of 5 mm was obtained. This plate-formed body of aluminum nitride was cut out so as to have a disc-like shape having a diameter of 330 mm, whereby a plate-formed body of aluminum nitride having a chuck positive electrostatic layer 2 and a chuck negative electrostatic layer 3 whose thickness were 15 μm, respectively inside thereof was obtained. The thickness of the ceramic dielectric film was 1000 μm.

(5) Next, a mask was set on the bottom face of the plate-formed body obtained in the above-mentioned (4) and a concave portion (not shown) and the like for embedding a thermocouple was formed on the surface by the blasting treatment using SiC and the like.

(6) Next, a conductor containing paste for forming a resistance heating element was printed on the surface (the bottom face) opposite to the wafer putting surface, whereby a printed body for a resistance heating element 15 was formed. As the conductor containing paste, "SOLVEST PS603D" manufactured by Tokuriki Kagaku Kenkyujo, which is used for forming a plated through hole of a printed circuit board, was employed. The conductor containing paste was a silver-lead paste containing 7.5 parts by weight of a metal oxide with respect to 100 parts by weight of silver. This conductor containing paste was a silver-lead paste and contained 7.5 parts by weight, per 100 parts by weight of silver, of metal oxides comprising lead oxide, zinc oxide, silica, boron oxide and alumina (the weight ratio thereof being 5/55/10/25/5). The average particle diameter of the silver particles was 4.5 μm and the shape of the silver particles was scaly.

(7) The plate-formed body on which the conductor containing paste had been printed was heated and fired at 780° C., so that the silver and lead contained in the conductor containing paste were sintered and baked on the ceramic substrate. The plate-formed body was immersed in an electroless nickel plating bath containing an aqueous solution of nickel sulfate (30 g/L) boric acid (30 g/L), ammonium chloride (30 g/L) and Rochelle salt (60 g/L), so that a nickel layer 150 of 1 μm thickness whose boron content was 1 weight % or less was deposited on the surface of the silver sintered body 15. Thereafter, the plate-formed body was subjected to the annealing treatment at 120° C. for 3 hours.

The thickness of the resistance heating element composed of the silver sintered body was 5 μm, the width thereof was 2.4 mm and the sheet resistivity was 7.7 mΩ/□.

(8) Next, a blind hole for exposing the conductor-filled through hole 16 was formed in the ceramic substrate. An external terminal pin made of Kovar was connected to the blind hole by using gold brazing of Ni—Au alloy (Au: 81.5 weight %, Ni: 18.4 weight % and impurities: 0.1 weight %) and heating and reflowing at 970° C. Further, an external terminal pin made of Kovar was formed at the resistance heating element by way of solder (tin: 9/lead: 1).

(9) Next, a plurality of thermocouples for controlling the temperature was embedded in the concave portion, whereby the electrostatic chuck 201 was obtained.

(10) Next, the electrostatic chuck 201 was fitted in a supporting case 41 made of stainless steel having a sectional shape as shown in FIG. 10 through a heat insulator 45 comprising ceramic fiber (manufactured by Ibiden co. under the trademark of "Ibiwool"). The supporting case 41 has a coolant outlet 42 of cooling gas, so that the temperature of the electrostatic 201 can be adjusted.

The resistance heating element 15 of the electrostatic chuck 201 fitted in the supporting case 41 was energized in order to raise the temperature of the electrostatic chuck and, also the coolant was flowed through the supporting case, so that the temperature of the electrostatic chuck 201 was controlled. The temperature control was very excellently performed.

EXAMPLE 7

Production of the Electrostatic Chuck 301 (FIG. 5)

(1) Two electrodes having shapes shown in FIG. 8 were formed by punching a tungsten foil having a thickness of 10 μm.

These two electrodes and tungsten wires were set in a mold, together with 100 parts by weight of aluminum nitride powder (manufactured by Tokuyama co., the average particle diameter: 1.1 μm) and 4 parts by weight of yttria (the average particle diameter: 0.4 μm), and were hot-pressed in nitrogen gas for 3 hours at 1890° C. and at a pressure of 150 kg/cm², whereby a plate-formed body of aluminum nitride having a thickness of 10 mm was obtained. This plate-formed body of aluminum nitride was cut out so as to have a disc-like shape having a diameter of 350 mm, whereby a disc-shaped plate formed body was obtained. Here, the thickness of the electrostatic electrode layer was 10 μm.

The thickness of the ceramic dielectric film was 2000 μm.

(2) This plate formed body was subjected to the processing steps of the above-mentioned (5) to (7) of example 1, whereby the electrostatic chuck 301 was obtained.

EXAMPLE 8

Production of the Electrostatic Chuck 401 (FIG. 6)

By carrying out the processing steps of the above-mentioned (1) to (5) of example 6, a plate-formed body of aluminum nitride having a diameter of 350 mm and thickness of 18 mm was obtained. Thereafter, nickel was thermal sprayed to the bottom face of the plate-shaped aluminum nitride and then a lead-tellurium based Peltier element was joined thereto, whereby the electrostatic chuck 401 was obtained. The thickness of the ceramic dielectric film was 2500 μm.

Comparatives Examples 8 to 11

In each of comparative examples 8 to 11, an electrostatic chuck was produced in a manner similar to that of examples 5 to 8, respectively, except that the thickness of the ceramic substrate was 25 mm. In each of comparative examples 8 to 11, the thickness of the ceramic dielectric film was 500 μm.

Comparative Example 12

Comparative example 12 was carried out in a manner similar to that of example 1, except that 2 parts by weight of yttria (the average particle diameter: 0.4 μm) was added.

Comparative Example 13

Comparative example 13 was carried out in a manner similar to that of example 1, except that the aluminum nitride powder as the raw material was heated for 3 hours so that oxygen was introduced thereto.

Comparative Example 14

Comparative example 14 was carried out in a manner similar to that of example 1, except that the thickness of the ceramic dielectric film was made to 10 $\mu$m by grinding.

Comparative Example 15

Comparative example 15 was carried out in a manner similar to that of example 1, except that the thickness of the ceramic dielectric film was made to 5500 $\mu$m.

The electrostatic chucks of examples 1 to 8 and comparative examples 1 to 15, obtained by the above-mentioned processes, were evaluated according to the parameters described below. The results are shown in Table 1.

Methods for Evaluation (1) Temperature rising time and temperature dropping time of the electrostatic chuck Each of the electrostatic chucks according to the examples and comparative examples was energized and the time required for the temperature of the electrostatic chuck to rise to 400° C. was measured. The time required for the temperature of the electrostatic chuck to naturally drop from 400° C. to 50° C. was also measured.

(2) Difference in temperature on the heating face

The difference in temperature between the highest temperature and the lowest temperature on the heating face when the temperature setting was 400° C. was measured by a thermoviewer ("IR162012-0012" manufactured by Japan Datum co.) for each of the electrostatic chucks according to the examples and comparative examples.

(3) The oxygen content in the ceramic dielectric film

Samples were sintered in the same condition for the sintered bodies according to the above-mentioned examples and comparative examples, respectively. Then, each sample was pulverized in a mortar made of tungsten. 0.01 g of each pulverized sample was collected and analyzed by using an oxygen/nitrogen determinator (TC-136 model, made by LECO company) in the condition in which the sample heating temperature was 2200° C. and the heating time was 30 seconds.

(4) Measurement of dispersion in the chucking force of the silicon wafer

Each of the electrostatic chucks according to the examples and comparative examples was energized in the state in which ten fractional pieces of a silicon wafer (which pieces were obtained by dividing a silicon wafer into ten parts) were set thereon, so that the temperature of the electrostatic chuck was raised to 400° C. The chucking force of the silicon wafer at each divided section was measured by a load cell, and the average value thereof was calculated. Further, the difference between the largest chucking force and the smallest chucking force was divided by the above-mentioned average, and the obtained value was expressed by percentage.

TABLE 1

| | Diameter (mm) | Thickness (mm) | Temperature rising time (sec.) | Temperature dropping time (min.) | Difference in temperature (° C.) | Film thickness ($\mu$m) | Oxygen content (wt. %) | Dispersion of chucking force (%) |
|---|---|---|---|---|---|---|---|---|
| Example 1 | 210 | 3 | 190 | 6.3 | 4 | 500 | 1.6 | 1 |
| Example 2 | 210 | 5 | 280 | 10.2 | 4 | 1000 | 1.6 | 1 |
| Example 3 | 250 | 10 | 560 | 23.3 | 8 | 2000 | 1.6 | 1.5 |
| Example 4 | 210 | 14 | 900 | 45 | 8 | 2500 | 1.6 | 1.5 |
| Comparative example 1 | 210 | 25 | 2250 | 112.5 | 15 | 500 | 1.6 | 4 |
| Comparative example 2 | 210 | 25 | 2240 | 112 | 15 | 1000 | 1.6 | 4 |
| Comparative example 3 | 250 | 25 | 2280 | 115 | 15 | 2000 | 1.6 | 4 |
| Comparative example 4 | 210 | 25 | 2230 | 110 | 15 | 2500 | 1.6 | 4 |
| Comparative example 5 | 190 | 25 | 1110 | 55 | 10 | 500 | 1.6 | 4 |
| Comparative example 6 | 210 | 3 | 190 | 6.3 | 10 | 500 | 0.08 | 3 |
| Comparative example 7 | 210 | 3 | 190 | 6.3 | 10 | 500 | 22 | 3 |
| Example 5 | 310 | 3 | 200 | 7.5 | 4 | 500 | 1.6 | 1 |
| Example 6 | 330 | 5 | 290 | 11.2 | 4 | 1000 | 1.6 | 1 |
| Example 7 | 350 | 10 | 580 | 24.5 | 6 | 2000 | 1.6 | 1.5 |
| Example 8 | 350 | 18 | 950 | 46 | 6 | 2500 | 1.6 | 1.5 |
| Comparative example 8 | 310 | 25 | 2300 | 114 | 15 | 500 | 1.6 | 4 |
| Comparative example 9 | 330 | 25 | 2350 | 115 | 15 | 500 | 1.6 | 4 |
| Comparative example 10 | 350 | 25 | 2350 | 115 | 15 | 500 | 1.6 | 4 |
| Comparative example 11 | 350 | 25 | 2400 | 116 | 15 | 500 | 1.6 | 4 |
| Comparative example 12 | 310 | 3 | 200 | 7.5 | 8 | 500 | 0.08 | 2 |
| Comparative example 13 | 310 | 3 | 200 | 7.5 | 8 | 500 | 22 | 2 |
| Comparative example 14 | 310 | 3 | 200 | 7.5 | 8 | 10 | 1.6 | 2 |
| Comparative example 15 | 310 | 3 | 200 | 7.5 | 8 | 5500 | 1.6 | 2 |

Note) Difference in termperature: Difference in temperature between the highest temperature and the lowest temperature As shown in Table 1, the time required for the temperature to reach 400° C. was 190 to 950 seconds in the electrostatic chucks according to examples 1 to 8, while the time required for the temperature to reach 400° C. was much longer in the electrostatic chucks according to comparative examples 1 to 5 and 8 to 11. The time required for the temperature dropping was reduced to 24.5 seconds or less by setting the thickness of the electrostatic chuck to 10 mm or less (examples 1 to 3, 5 to 7). Further the difference in temperature was kept within 4° C., which is ideal, by setting the thickness and the oxygen content of the electrostatic chuck to be 5 mm or less and 20 weight % or less, respectively.

The property of chucking force and the like of the electrostatic chucks bear no problems in both of the examples and the comparative examples. The substrate whose diameter is 300 mm or more exhibited a significant drop of the temperature at the peripheral portion thereof when the thickness of the electrostatic chuck exceeds 25 mm. Therefore, by adjusting the thickness of the electrostatic chuck in a range of 25 mm or less, the dispersion of the temperature and the chucking force at the heating face of the electrostatic chuck can be reduced. Further, by adjusting the thickness of the dielectric film and the oxygen content in the dielectric film, the dispersion of the temperature and the chucking force on the heating face can be reduced.

Industrial Applicability

As described above, the electrostatic chucks according to the first and the second aspect of the present invention do not have so large heat capacity and exhibit excellent temperature rising/dropping property, in spite of the relatively large diameter size of the ceramic substrate thereof, since thickness of the electrostatic chucks has been reduced. Further, since the electrostatic chuck device can be made lighter and thinner as a whole, not only transportation of the device is made easy but also the space occupied by the device in the operation such as semiconductor production can be reduced.

What is claimed is:

1. An electrostatic chuck comprising:
   a ceramic substrate comprising at least one of a nitride and a carbide, said ceramic substrate being equipped with a temperature controlling means;
   an electrostatic electrode formed on said ceramic substrate; and
   a ceramic dielectric film provided on said electrostatic electrode, wherein:
      said ceramic substrate has a diameter exceeding 190 mm and a thickness of 20 mm or less, and
      said ceramic dielectric film contains oxygen in an amount of 0.1 to 20 weight %.

2. The electrostatic chuck according to claim 1, wherein said temperature controlling means comprises a resistance heating element.

3. The electrostatic chuck according to claim 1, wherein the thickness of said ceramic substrate is within a range of 3 to 14 mm.

4. An electrostatic chuck comprising:
   a ceramic substrate equipped with a temperature controlling means;
   an electrostatic electrode formed on said ceramic substrate; and
   a ceramic dielectric film provided on said electrostatic electrode,
   wherein said ceramic substrate has a diameter exceeding 300 mm and a thickness of 20 mm or less.

5. The electrostatic chuck according to claim 4, wherein said ceramic dielectric film contains oxygen in an amount of 0.1 to 20 weight %.

6. The electrostatic chuck according to claim 4, wherein said temperature controlling means comprises a resistance heating element.

7. The electrostatic chuck according to claim 1, wherein the thickness of said ceramic dielectric film is in a range of 50 to 5000 µm.

8. The electrostatic chuck according to claim 5, wherein a resistance heating element is used as said temperature controlling means.

9. The electrostatic chuck according to claim 2, wherein the thickness of said ceramic dielectric film is in a range of 50 to 5000 µm.

10. The electrostatic chuck according to claim 4, wherein the thickness of said ceramic dielectric film is in a range of 50 to 5000 µm.

11. The electrostatic chuck according to claim 5, wherein the thickness of said ceramic dielectric film is in a range of 50 to 5000 µm.

12. The electrostatic chuck according to claim 6, wherein the thickness of said ceramic dielectric film is in a range of 50 to 5000 µm.

13. The electrostatic chuck according to claim 8, wherein the thickness of said ceramic dielectric film is in a range of 50 to 5000 µm.

14. The electrostatic chuck according to claim 4, wherein material of said ceramic substrate is nitride ceramic or carbide ceramic.

15. The electrostatic chuck according to claim 4, wherein the thickness of said ceramic substrate is within a range of 3 to 18 mm.

16. The electrostatic chuck according to claim 4, wherein the diameter of said ceramic substrate is within a range of 310 to 350 mm.

* * * * *